(12) United States Patent  
Mallet

(10) Patent No.: US 9,778,334 B2
(45) Date of Patent: Oct. 3, 2017

(54) MAGNETIC SHIMMING AND MAGNET ARRANGEMENTS

(71) Applicant: HTS-110 Limited, Gracefield, Lower Hutt (NZ)

(72) Inventor: Michael John Disney Mallet, Lower Hutt (NZ)

(73) Assignee: Scott Technology NZ Limited, Kenmure, Dunedin (NZ)

( * ) Notice: Subject to any disclaimer, the term of this patent is extended or adjusted under 35 U.S.C. 154(b) by 0 days.

(21) Appl. No.: 14/706,360

(22) Filed: May 7, 2015

(65) Prior Publication Data

US 2015/0323627 A1 Nov. 12, 2015

(30) Foreign Application Priority Data

May 7, 2014 (NZ) ...................................... 624642

(51) Int. Cl.
| | |
|---|---|
| G01R 33/387 | (2006.01) |
| G01R 33/3873 | (2006.01) |
| H01F 7/02 | (2006.01) |
| H01F 7/20 | (2006.01) |

(52) U.S. Cl.
CPC ....... *G01R 33/3873* (2013.01); *G01R 33/387* (2013.01); *H01F 7/0284* (2013.01); *H01F 7/20* (2013.01)

(58) Field of Classification Search
CPC ................................................ G01R 33/3873
USPC .................................. 335/301; 324/318–320
See application file for complete search history.

(56) References Cited

U.S. PATENT DOCUMENTS

| | | | |
|---|---|---|---|
| 4,680,551 A | 7/1987 | O'Donnell et al. | |
| 5,047,720 A | 9/1991 | Guy | |
| 5,550,472 A * | 8/1996 | Richard | G01R 33/3873 324/319 |
| 5,736,859 A * | 4/1998 | Gore | G01R 33/3873 324/319 |

(Continued)

FOREIGN PATENT DOCUMENTS

| | | |
|---|---|---|
| DE | 19901331 | 7/2000 |
| EP | 0 272 411 | 6/1988 |

*Primary Examiner* — Ramon M Barrera
(74) *Attorney, Agent, or Firm* — Merchant & Gould P.C.

(57) ABSTRACT

A passive magnetic field shim arrangement including a plurality of shim pairs. For shimming a number of magnetic field harmonics, each shim pair may include a first shim and a second opposite and substantially equal shim, each shim pair being configured for shimming one of the magnetic field harmonics. Each shim pair may include a first shim of order N and a second opposite and substantially equal shim of order N, the first and second shims together defining a magnetic field shim correction of order N−1. Each shim may include one or more shim elements arranged on a non-magnetic tubular support, the tubular supports being dimensioned such that the tubular supports may be arranged concentrically in relation to each other. A magnetic field may be shimmed by providing a shim pair configured for shimming a magnetic field harmonic, the shim pair including a first shim and a second opposite and substantially equal shim and symmetrically adjusting an axial position of the first shim and an axial position of the second shim to provide a desired shimming magnitude in order to shim the magnetic field harmonic.

22 Claims, 18 Drawing Sheets

(56) References Cited

U.S. PATENT DOCUMENTS 6,313,634 B1 11/2001 Kasten
6,897,750 B2 5/2005 Neuberth

\* cited by examiner

MAGNETIC SHIMMING AND MAGNET ARRANGEMENTS

This application claims benefit of Serial No. 624642, filed 7 May 2014 in New Zealand and which application is incorporated herein by reference. To the extent appropriate, a claim of priority is made to the above disclosed application.

FIELD OF THE INVENTION

The invention relates to shimming of magnetic fields, in particular to passive or ferromagnetic shimming, and/or to magnet arrangements for providing a desired profile of magnetic harmonics.

BACKGROUND TO THE INVENTION

For various applications it is desirable to create a measurement region with a homogeneous magnetic field. The measurement region will generally be positioned within the bore of an electromagnet, although in some applications an array of permanent magnets may be used. A homogeneous magnetic field is desirable in particular in Nuclear Magnetic Resonance ("NMR") and Magnetic Resonance Imaging ("MRI") applications.

The magnetic field will generally include a desired field, which ideally should be homogeneous through the measurement region, together with a number of contaminant harmonics that create inhomogeneities. Inhomogeneity in the magnetic field arises for various reasons, including: magnet design, manufacturing deviations in the assembly of the magnet, the presence of ferromagnetic materials in or near the magnets or differences in the magnetic susceptibility of materials used to manufacture the magnet or within the sample volume.

In practice, creation of high quality magnetic field homogeneity is difficult. To improve magnetic field homogeneity, ferromagnetic or electrical shimming of the field may be used.

Ferromagnetic shims are discussed, for example, in EP0272411B1, U.S. Pat. No. 6,313,634 and U.S. Pat. No. 5,047,720. The process of ferromagnetic shimming is generally achieved by one of two methods, both relying on placement of passive shims or tiles of ferromagnetic material in the magnetic field.

First, a number of ferromagnetic 'tiles' may be placed at fixed locations to form a pattern of tiles within a magnet bore. The placement of ferromagnetic material within the magnet bore will distort the magnetic field by a known amount. An algorithm can be used to calculate an initial arrangement of tiles to create the required correction harmonics. In general each individual shim tile contributes to each correction harmonic. After the initial placement of tiles, the number and position of the tiles can be adjusted iteratively, based on measurements of the magnetic field. This process is usually iterated a number of times, adding or subtracting shim tiles until the magnetic field is improved to an acceptable degree. Typically there will be several hundred to a thousand or more tiles used. The iterative placement of the tiles can be time consuming.

Second, a predefined shape of ferromagnetic material can be fashioned to correct for a given number of contaminant harmonics.

The above approaches are both complex and time consuming to install, or do not allow adequate 'tuning' of the field.

Electrical shimming is also used in some applications. Electrical shimming involves controlled variation of the current in a set number of shimming coils to create a relatively pure harmonic correction. However, this requires further coils and power sources with associated control requirements. It is therefore a more expensive solution than ferromagnetic shimming. Further, the magnitude of correction available by electrical shimming is limited by how much current can be passed through the available volume without unacceptable heat production. Heat production is particularly problematic in NMR magnets where changes in local temperature can affect the performance of the NMR measurement components. In this case a cooling air supply can be employed but total heat production should preferably be restricted to 10 watts or less. This creates a limit to the amount of current that can be introduced into the electric shims. There is no heat generated by ferromagnetic shims in a static background magnetic field.

Reference to any prior art in this specification does not constitute an admission that such prior art forms part of the common general knowledge.

It is an object of the invention to provide improved magnetic field shimming and/or an alternative method of improving magnetic field homogeneity, or at least to provide the public with a useful choice.

It is an alternative object of the invention to provide an improved magnet arrangement for providing a desired magnetic field profile, or at least to provide the public with a useful choice.

SUMMARY OF THE INVENTION

In a first aspect the invention provides a passive magnetic field shim arrangement including a plurality of shim pairs, each shim pair including a first shim of order N and a second opposite and substantially equal shim of order N, the first and second shims together defining a magnetic field shim correction of order N−1.

Each shim pair may be configured for shimming a single magnetic field harmonic.

Preferably the plurality of shim pairs is a continuous set of shim pairs configured to shim magnetic field harmonics from first order up to a highest order magnetic field harmonic desired to be corrected.

Preferably the plurality of shim pairs includes at least one shim pair per magnetic harmonic to be corrected.

Preferably the plurality of shim pairs includes a first shim pair configured for shimming a first magnetic field harmonic and a second shim pair configured for fine shimming of the first magnetic field harmonic.

Preferably each shim pair contributes a shimming term that is substantially pure in a single magnetic field harmonic.

Preferably the shims are configured to shim axial cylindrical harmonics of the magnetic field.

Preferably the first and second shims together defining an axially symmetric or anti-symmetric shim pair.

Preferably the arrangement is configured for installation in a magnetic apparatus, to shim a magnetic field in that apparatus so as to improve homogeneity of the magnetic field in a measurement region.

Preferably each shim includes shim elements of ferromagnetic or permanent magnetic material.

The arrangement may include an adjustment mechanism configured for controllable adjustment of the positions of the shims.

Preferably each shim includes one or more shim elements arranged on a non-magnetic tubular support.

Preferably the tubular supports are dimensioned such that the tubular supports may be arranged concentrically in relation to each other.

Preferably the tubular supports have circular cross-sections.

Preferably the tubular supports are arranged to slide with respect to each other.

Preferably each shim includes a plurality of shim elements.

Preferably each shim element is radially symmetric.

Preferably each shim element is an annular element.

Preferably the arrangement is configured for shimming a solenoidal magnet or a split pair magnet.

Preferably the arrangement is configured for shimming a magnetic field in a nuclear magnetic resonance apparatus or a magnetic resonance imaging apparatus.

Preferably the magnitude of the correction provided by each shim pair is a function of the axial positions of the first and second shims.

This aspect also extends to a magnetic apparatus including one or more magnets defining a magnetic field in a measurement region, and an arrangement as defined above configured to shim the magnetic field in the measurement region.

In a second aspect the invention provides a passive magnetic field shim arrangement including a set of shim pairs for shimming a number of magnetic field harmonics, each shim pair including a first shim and a second opposite and substantially equal shim, each shim pair being configured for shimming one of the magnetic field harmonics.

Preferably the set of shim pairs is a continuous set of shim pairs configured to shim magnetic field harmonics from first order up to a highest order magnetic field harmonic desired to be corrected.

Preferably the set of shim pairs includes at least one shim pair per magnetic harmonic to be corrected.

Preferably the set of shim pairs includes a first shim pair configured for shimming a first magnetic field harmonic and a second shim pair configured for fine shimming of the first magnetic field harmonic.

Preferably each shim pair contributes a shimming term that is substantially pure in a single magnetic field harmonic.

Preferably the shims are configured to shim axial cylindrical harmonics of the magnetic field.

Preferably the first and second shims together defining an axially symmetric or anti-symmetric shim pair.

Preferably the arrangement is configured for installation in a magnetic apparatus, to shim a magnetic field in that apparatus so as to improve homogeneity of the magnetic field in a measurement region.

Preferably each shim includes shim elements of ferromagnetic or permanent magnetic material.

The arrangement may include an adjustment mechanism configured for controllable adjustment of the positions of the shims.

Preferably each shim includes one or more shim elements arranged on a non-magnetic tubular support.

Preferably the tubular supports are dimensioned such that the tubular supports may be arranged concentrically in relation to each other.

Preferably the tubular supports have circular cross-sections.

Preferably the tubular supports are arranged to slide with respect to each other.

Preferably each shim includes a plurality of shim elements.

Preferably each shim element is radially symmetric.

Preferably each shim element is an annular element.

Preferably the arrangement is configured for shimming a solenoidal magnet or a split pair magnet.

Preferably the arrangement is configured for shimming a magnetic field in a nuclear magnetic resonance apparatus or a magnetic resonance imaging apparatus.

Preferably the magnitude of the correction provided by each shim pair is a function of the axial positions of the first and second shims.

This aspect also extends to a magnetic apparatus including one or more magnets defining a magnetic field in a measurement region, and the arrangement configured to shim the magnetic field in the measurement region.

In a third aspect the invention provides a passive magnetic field shim arrangement including a plurality of shim pairs, each shim pair including a first shim and a second opposite and substantially equal shim, the first and second shims together defining an axially symmetric or anti-symmetric shim pair.

Preferably the plurality of shim pairs is a continuous set of shim pairs configured to shim magnetic field harmonics from first order up to a highest order magnetic field harmonic desired to be corrected.

Preferably the plurality of shim pairs includes at least one shim pair per magnetic harmonic to be corrected.

Preferably the plurality of shim pairs includes a first shim pair configured for shimming a first magnetic field harmonic and a second shim pair configured for fine shimming of the first magnetic field harmonic.

Preferably each shim pair contributes a shimming term that is substantially pure in a single magnetic field harmonic.

Preferably the shims are configured to shim axial cylindrical harmonics of the magnetic field.

Preferably the first and second shims together defining an axially symmetric or anti-symmetric shim pair.

Preferably the arrangement is configured for installation in a magnetic apparatus, to shim a magnetic field in that apparatus so as to improve homogeneity of the magnetic field in a measurement region.

Preferably each shim includes shim elements of ferromagnetic or permanent magnetic material.

The arrangement may include an adjustment mechanism configured for controllable adjustment of the positions of the shims.

Preferably each shim includes one or more shim elements arranged on a non-magnetic tubular support.

Preferably the tubular supports are dimensioned such that the tubular supports may be arranged concentrically in relation to each other.

Preferably the tubular supports have circular cross-sections.

Preferably the tubular supports are arranged to slide with respect to each other.

Preferably each shim includes a plurality of shim elements.

Preferably each shim element is radially symmetric.

Preferably each shim element is an annular element.

Preferably the arrangement is configured for shimming a solenoidal magnet or a split pair magnet.

Preferably the arrangement is configured for shimming a magnetic field in a nuclear magnetic resonance apparatus or a magnetic resonance imaging apparatus.

Preferably the magnitude of the correction provided by each shim pair is a function of the axial positions of the first and second shims.

This aspect also extends to a magnetic apparatus including one or more magnets defining a magnetic field in a measurement region, and the arrangement configured to shim the magnetic field in the measurement region.

In a fourth aspect the invention provides a passive magnetic field shim arrangement including a plurality of shims, each shim including one or more shim elements arranged on a non-magnetic tubular support, the tubular supports being dimensioned such that the tubular supports may be arranged concentrically in relation to each other.

Preferably the tubular supports have circular cross-sections.

Preferably the tubular supports are arranged to slide with respect to each other.

Preferably each shim includes a plurality of shim elements.

Preferably each shim element is radially symmetric.

Preferably each shim element is an annular element.

The arrangement may include an adjustment mechanism configured for controllable adjustment of the positions of the shims.

In a fifth aspect the invention provides a magnet arrangement including a set of permanent magnet pairs for creating a magnetic field with a desired set of magnetic field harmonics, each magnet pair including a first permanent magnetic shim and a second opposite and substantially equal permanent magnetic shim, each shim pair being configured for providing one of the set of magnetic field harmonics.

Preferably the first and second shims are of order N, the first and second shims together providing a magnetic field harmonic of order N−1.

Preferably the plurality of magnet pairs is a continuous set of magnet pairs configured to provide magnetic field harmonics from first order up to a highest order magnetic field harmonic desired.

Preferably the plurality of magnet pairs includes at least one magnet pair per magnetic harmonic to be corrected.

Preferably the plurality of magnet pairs includes a first magnet pair configured to provide a first magnetic field harmonic and a second magnet pair configured for fine tuning of the first magnetic field harmonic.

Preferably each magnet pair contributes a magnetic field term that is substantially pure in a single magnetic field harmonic.

Preferably the first and second magnetic shims together defining an axially symmetric or anti-symmetric shim pair.

Preferably each shim includes shim elements of permanent magnetic material.

The arrangement may include an adjustment mechanism configured for controllable adjustment of the positions of the shims.

Preferably each shim includes one or more shim elements arranged on a non-magnetic tubular support.

Preferably the tubular supports are dimensioned such that the tubular supports may be arranged concentrically in relation to each other.

Preferably the tubular supports have circular cross-sections.

Preferably the tubular supports are arranged to slide with respect to each other.

Preferably each shim includes a plurality of shim elements.

Preferably each shim element is radially symmetric.

Preferably each shim element is an annular element.

Preferably the magnitude of the harmonic provided by each shim pair is a function of the axial positions of the first and second shims.

In a further aspect the invention provides a method of shimming a magnetic field, including: providing a shim pair configured for shimming a magnetic field harmonic, the shim pair including a first shim and a second opposite and substantially equal shim; symmetrically adjusting an axial position of the first shim and an axial position of the second shim to provide a desired shimming magnitude in order to shim the magnetic field harmonic.

In general, each shim pair is configured to cancel a single harmonic. However, higher order shim pairs (N>2) will create correction terms that are non-singular harmonic in nature, as discussed below. Such shims fall within the scope of invention. In this specification, shimming a magnetic field harmonic involves correction of that magnetic field harmonic. However, this shimming may introduce magnetic field terms of other orders, which may themselves be corrected by other shims. Preferably the shims are designed to be substantially pure in a single harmonic, with the terms of other orders having magnitudes that are small compared to the term at the target harmonic.

BRIEF DESCRIPTION OF THE DRAWINGS

The invention will now be described by way of example only, with reference to the accompanying drawings, in which.

DETAILED DESCRIPTION

Figure 1:
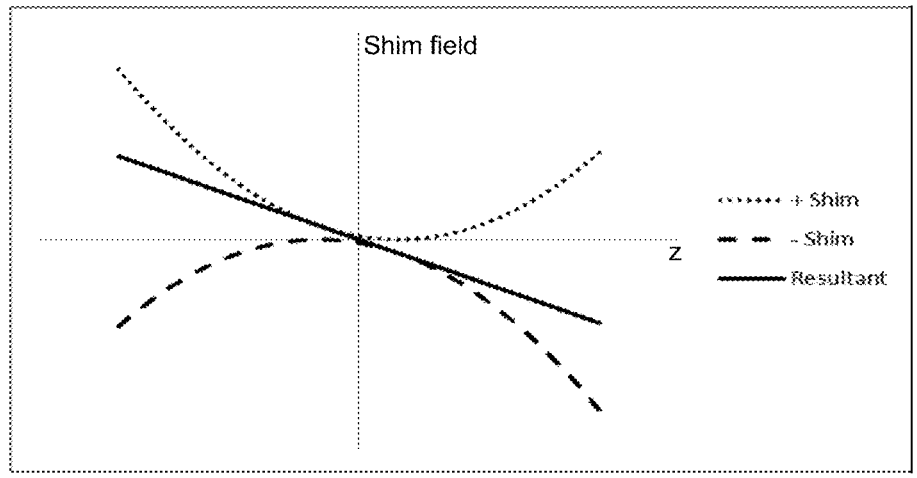
FIG. 1 illustrates the effect of a second order shim pair according to one embodiment.

In general, a given magnetic field over a specific volume can be decomposed into a harmonic series of cylindrical or spherical harmonics. Each member of the harmonic series is orthogonal to every other member. The Applicant's invention relies on use of a shim producing a specific harmonic response to adjust a single contaminant harmonic. A series of such 'pure' shims can be used to adjust a number of harmonics within the harmonic series. In particular, the Applicant's shims allow elimination of a series of axial contaminant harmonics (axial harmonics vary in the z direction only, i.e. along the axis of the magnetic coil). While the shims ideally would be pure, that is each shim will be directed only to one contaminant harmonic, in practice some shims will themselves give rise to further contaminant fields. Those fields can themselves be shimmed as discussed in detail below.

In this application the invention relates to magnetic fields measured on the surface of a cylinder, the same invention can be used for fields measured on the surface of a sphere, prolate or oblate ellipsoid, or other similar target volumes. A magnetic field, B, on the surface of an open cylinder, can be described as the sum of a set of cylindrical harmonics, for example:

$$B = B_{00} + B_{10}z + B_{11}R\cos\theta + B_{20}z^2 + B_{21}zR\cos\theta + B_{22}R\cos 2\theta + B_{30}z^3 + B_{31}z^2R\cos\theta + B_{32}zR\cos 2\theta + B_{33}R\cos 3\theta \ldots$$

where z, R and $\theta$ represent the axial, radial and azimuthal coordinates of the cylindrical coordinate system. The measurement of the magnetic field occurs at a normalised value of radius, $R_0$, so the expression for the field expansion at the normalised radius is dependent on z and $\theta$ only. The terms $B_{NM}$ represent the magnitude of the individual harmonic terms. The range of N is from 0 to a maximum evaluated harmonic term (usually for practical purposes less than 12), the range of M is from 0 to N.

When M=0 the magnetic field harmonic is a radially symmetric term which varies in z only. Fur the purposes of the current invention we are concerned only with these radially symmetric terms, i.e. we need consider harmonic terms for the case M=0 only. These harmonic terms are usually the largest encountered in a practical solenoidal magnet design. They are therefore the most important terms to correct. In effect this specifically targets only the axial terms of the field expansion; i.e. those which have no dependence on the azimuthal term $\theta$. For present purposes, the magnetic field therefore simplifies to the following form:

$$B = B_{00} + B_{10}z + B_{20}z^2 + B_{30}z^3 + B_{40}z^4 \ldots$$

The magnetic field of interest therefore includes a constant term $B_{00}$ and a number of harmonic terms varying with z, $z^2$, $z^3$ etc. The goal of the Applicant's shimming is, as far as possible, to remove the harmonic terms. This will leave only a constant term independent of z through the measurement region, thereby improving the homogeneity of the magnetic field in that region.

The invention relies upon the accurate placement of pairs of passive shims. Each shim is preferably a ferromagnetic shim. Each shim pair includes two ferromagnetic shims, each of which produces an equal and opposite, preferably relatively pure, shimming harmonic of order N to produce a combined total shimming harmonic of order N−1, as will become clear below. Although relatively pure, some shim pairs may introduce magnetic field terms of other orders. These other terms can themselves be shimmed.

Shimming N=0 Term

For completeness we will begin with discussion of shimming to create a zero$^{th}$ order correction term (that is, a term independent of z). In practice however, shimming will generally not be used for adjustment of the zero$^{th}$ order magnetic field term. If adjustment of this term is desired this can be achieved by adjusting the background magnetic field itself (for example by control of the power supplied to the electromagnet).

In theory however, the zero$^{th}$ order term could be shimmed using a pair of first order shims. The two first order shims would be of identical but opposite magnitude and individually create first order (that is, first order in z) shimming harmonics $f_1$ and $f_2$, where $f_1 = +B_{10}z + B_{00,1}$ and $f_2 = -B_{10}z + B_{00,2}$, where $B_{00,1}$ and $B_{00,2}$ represent a field offset of each shim harmonic due to the presence of ferromagnetic material within the magnet. The two shims are placed at positions $+z_0$ and $-z_0$, symmetrically arranged around a centre point of the magnet. The combined shimming harmonic is given by the sum of the two shims:

$$(f_1 + f_2) = B_{10}(z - z_0) + B_{00,1} - B_{10}(z + z_0) + B_{00,2}$$

$$(f_1 + f_2) = -2B_{10}z_0 + (B_{00,1} + B_{00,2})$$

The combined shimming harmonic of the two first order shims is therefore a zero$^{th}$ order correction term $-2B_{10}z_0$ with a field offset. The magnitude of the zero$^{th}$ order correction term could be varied linearly by changing the positions of the two shims, i.e. by varying $z_0$.

The $(B_{00,1} + B_{00,2})$ term is a zero$^{th}$ order field offset term which could be corrected by varying the strength of the background magnetic field. Alternatively, careful design of the two ferromagnetic shims could yield a combined zeroth order term of zero if $B_{00,1} = -B_{00,2}$.

However, as noted above shimming of the zero$^{th}$ order term is unlikely to be used in practice.

Shimming N=1 term

The first order term may be shimmed using a pair of second order shims. The two second order shims, of identical but opposite magnitude, individually create shimming harmonics of $f_1 = +B_{20}z^2 + B_{00,1}$ and $f_2 = -B_{20}z^2 + B_{00,2}$, where $B_{00,1}$ and $B_{00,2}$ represent a field offset of each shim harmonic due to the presence of ferromagnetic material within the magnet. The shims are placed at positions $+z_0$ and $-z_0$. The combined shimming harmonic is given by the sum of the two shims.

$$(f_1+f_2)=B_{20}(z-z_0)^2+B_{00,1}-B_{20}(z+z_0)^2+B_{00,2}$$

$$(f_1+f_2)=-4B_{20}z_0z+(B_{00,1}+B_{00,2})$$

The effects of the two second order shims are shown in FIG. 1. As shown, the positive shim field f1 and the negative shim field f2 combine to provide a resultant shimming field (shown in solid line) that varies linearly with z.

The combined shimming harmonic of the two second order shims is therefore a first order correction term. The magnitude of the first order correction term can be varied linearly by changing the positions of the two shims, $z_0$.

The $(B_{00,1}+B_{00,2})$ term is a zero$^{th}$ order field offset term which can be corrected by varying the strength of the background magnetic field (for example by altering the power supplied to the electromagnet). Alternatively, careful design of the two ferromagnetic shims can yield a combined zero$^{th}$ order term of zero if $B_{00,1}=-B_{00,2}$.

Shimming N=2 term

A similar approach can be used to create a combined shimming harmonic of second order. This time we choose two equal, but opposite third order shims, $f_1=+B_{30}z^3+B_{00,1}$ and $f_2=-B_{30}z^3+B_{00,2}$. Using a similar approach to above, the combined shimming harmonic is given by:

$$(f_1+f_2)=-6B_{30}z_0z^2-2B_{30}z_0^3+(B_{00,1}+B_{00,2})$$

Figure 2:
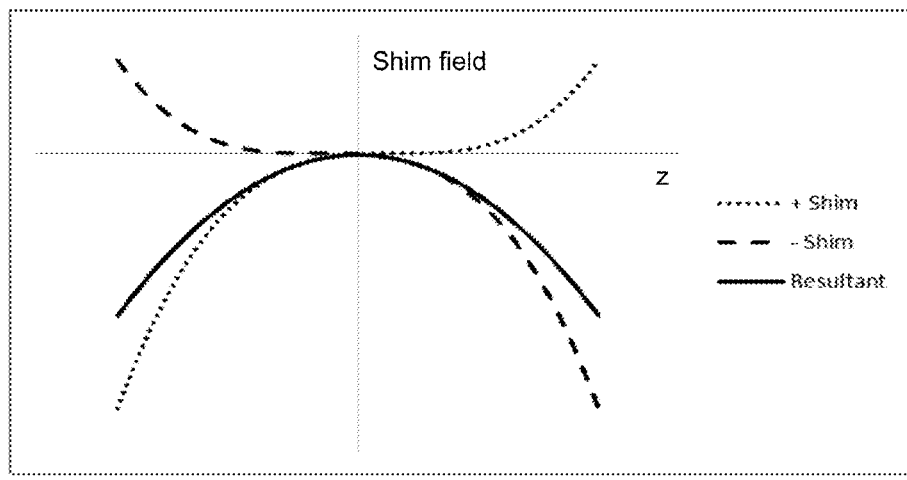
FIG. 2 illustrates the effect of a third order shim pair according to one embodiment.

The effects of the two third order shims are shown in FIG. 2. As shown, the positive shim field f1 and the negative shim field f2 combine to provide a resultant shimming field (shown in solid line) that is a function of $z^2$.

The combined harmonic is of second order in z but also has a third order term in $z_0$. This third order term represents a zero$^{th}$ order (i.e. zero$^{th}$ order in z) field offset dependent upon the value of $z_0$ used to correct the second order contaminant term. This zero$^{th}$ order term along with the $(B_{00,1}+B_{00,2})$ term can again be corrected by varying the background magnetic field.

Shimming N=3 term

Similarly to the cases for N=1 and N=2, a third order correction term can be created by combining two fourth order shims, $f_1=+B_{40}z^4+B_{00,1}$ and $f_2=-B_{40}z^4+B_{00,2}$. These give a combined correction harmonic of:

$$(f_1+f_2)=-8B_{40}z_0z^3-8B_{40}z_0^3z+(B_{00,1}+B_{00,2})$$

Figure 3:
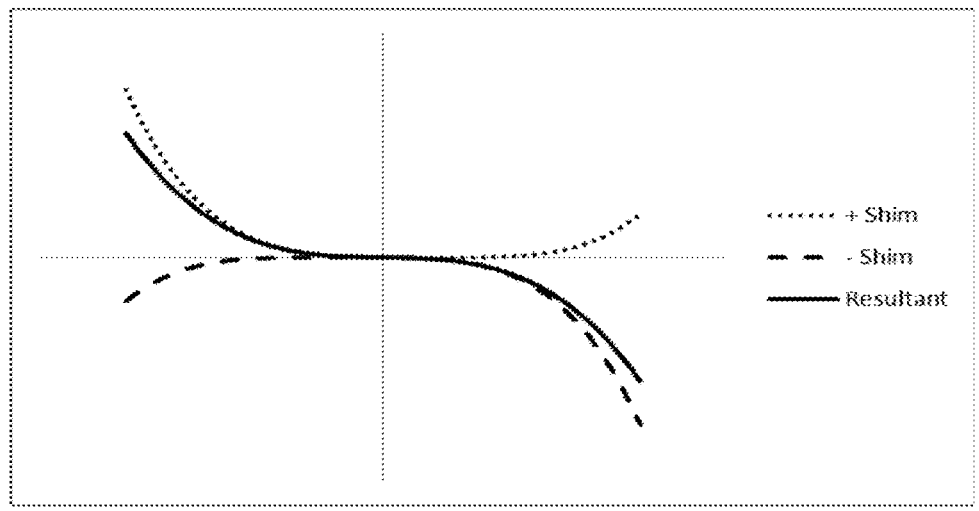
FIG. 3 illustrates the effect of a fourth order shim pair according to one embodiment.

The effects of the two fourth order shims are shown in FIG. 3.

However, the combined harmonic is no longer a single order shim with a DC offset. In this case it is a combination of a shimming term that is third order in z (i.e. $-8B_{40}z_0z^3$) and a term that is first order in z (i.e. $-8B_{40}z_0^3z$). This shim pair therefore creates an undesirable first order contaminant term. However it is then possible to create a single third order correction by combining the solutions for N=3 and N=1, such that when a third order correction is required it is achieved by varying both the third order correction shim and the first order correction shim. This will mean that the first order terms in the third order and first order correction shims will cancel each other to leave a third order correction and any remaining first order correction that is required.

Figure 4:
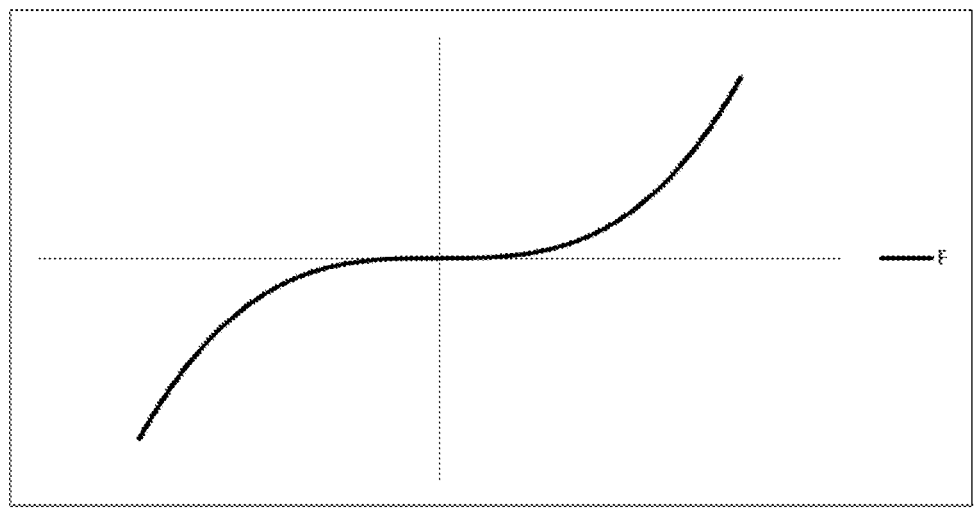
FIG. 4 illustrates an exemplary contaminant harmonic.

For example, consider correction of a contaminant harmonic $F=3z^3+4z$, which has the form shown in FIG. 4. If we assume that all the correction shim magnitudes are normalised such that $B_{40}=1$ for each shim then we can create a third order correction thus (ignoring the DC offset):

$$F'=F+(3\text{rd order shim})=(3z^3+4z)-8z_0z^3-8z_0^3z$$

By setting $z_0=\tfrac{3}{8}$ we can correct the third order term, with the result that:

$$F'=(4-8(\tfrac{3}{8})^3)z$$

Figure 5:
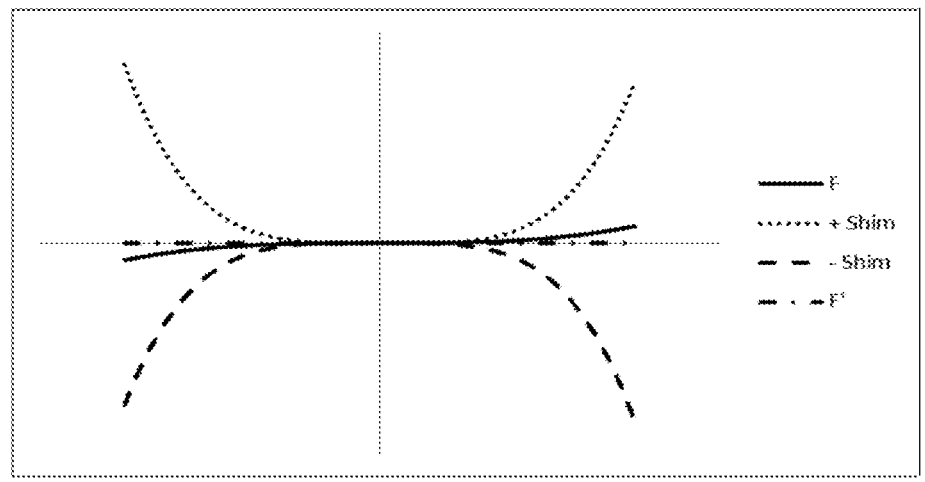
FIG. 5 illustrates a first correction of the harmonic of FIG. 4.

The contaminant harmonic (F), shims $f_1$ and $f_2$, and the residual first order term (F') are shown in FIG. 5.

Thus the axial shim position $z_0=(\tfrac{3}{8})$ for the third order shim. To this we can then add a first order correction (again ignoring the DC offset and assuming $B_{20}=1$) to remove the residual first order term F', $$F''=F'+(1\text{st order shim})=(4-8(\tfrac{3}{8})^3)z-4z_0z$$

By setting $z_0=1-2(\tfrac{3}{8})^3$ we can correct the first order term, with the result that F''=0.

Figure 6:
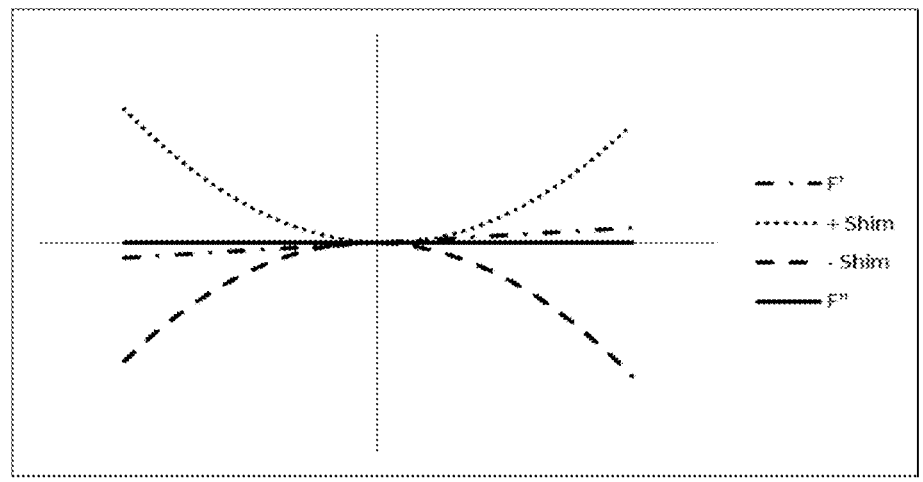
FIG. 6 illustrates a second correction of the harmonic of FIG. 4.

The residual first order term (F'), shims $f_1$ and $f_2$, and the fully shimmed term (F'') are shown in FIG. 6.

Thus the axial shim position $z_0=(1-2(\tfrac{3}{8})^3)$ for the first order shim.

Shimming N=4 term

Similarly to the cases for N=1, N=2 and N=3, a fourth order correction term can be created by combining two fifth order shims, $f_1=+B_{50}z^5+B_{00,1}$ and $f_2=-B_{50}z^5+B_{00,2}$. These give a combined correction harmonic of:

$$(f_1+f_2)=-10B_{50}z_0z^4-20B_{50}z_0^3z^2-2B_{50}z_0^5+(B_{00,1}+B_{00,2})$$

Figure 7:
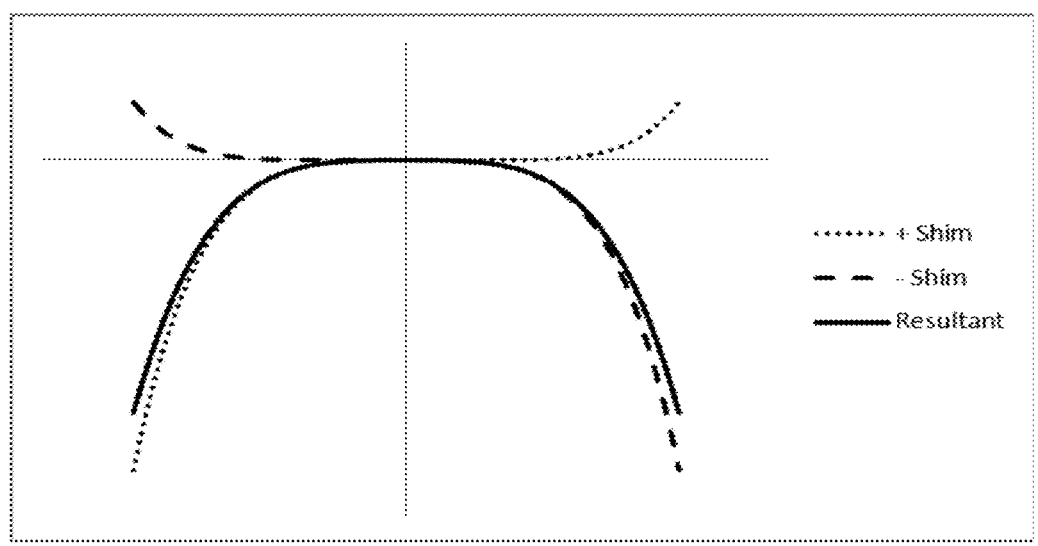
FIG. 7 illustrates the effect of a fifth order shim pair according to one embodiment.

The effects of the two fifth order shims are shown in FIG. 7.

The combined correction harmonic has a fourth order and a second order term, along with a DC offset. The second order term can be corrected by suitable adjustment of the two shims controlling the N=2 term in a similar manner to the corrections discussed above.

Shimming N>4 terms

Higher order terms can be shimmed using the same approach. This means that any combination of axial harmonic contaminants can be corrected by the relative movement of the shim pairs which control the individual harmonic correction terms.

In general, to correct a given single contaminant harmonic it is necessary to have a paired set of equal but opposite magnitude ferromagnetic shims of one order higher than that of the contaminant harmonic. For example, to correct a sixth contaminant harmonic, a pair of seventh order shims will be used.

Higher order correction shims (N>2) will in general create correction terms that are non-singular harmonic in nature (see above) so to fully correct for orders above N=2 it is necessary to also have available shim pairs to correct for the created lower orders. For example, if an N=4 contaminant is to be corrected it is necessary to have a first fifth order shim pair to create $+/-B_{50}$ to correct for the fourth order term; and a third order shim pair to create $+/-B_{30}$ to correct for the second order term introduced by the fifth order shim pair. This is generally not a problem since it is unlikely that a magnetic field only has high order contaminants that need to be corrected. It is generally the case that all orders up to a maximum value of N will have correction shims available.

The strength of the combined shim harmonic of order N is dependent upon the strength of the underlying passive shims of order N+1 and their position relative to each other (i.e. their axial positions $z_0$). The strength of the passive shim is controlled during shim manufacture by appropriate selection of the amount and distribution of ferromagnetic material. The axial positions will be controlled during installation of the shims.

In general lower order harmonics are of greatest magnitude, with the magnitude decreasing rapidly with the order N of the contaminant harmonic.

EXAMPLE 1

An example of the magnitude of required passive shims will now be described.

It is common in the field of Nuclear Magnetic Resonance (NMR) to express the strength of a contaminant harmonic or a correction harmonic in terms of Deuterium Hertz (DHz). The Deuterium Hertz is a measure of magnetic field strength where 1 DHz is equivalent to $1.53 \times 10^{-7}$ tesla.

Table 1 shows the shim magnitudes required to correct given contaminant magnitudes assuming $z_0 = 1$ cm.

TABLE 1

| Contaminant (Order N) | Magnitude (DHz @ 1 cm) | Correction term (Matched shims of order N + 1) | Shim magnitude (DHz @ 1 cm, $z_0 = 1$ cm) |
|---|---|---|---|
| $B_{00}$ | 5000 | $2B_{10}z_0$ | 2500 ($B_{10}$) |
| $B_{10}$ | 1000 | $4B_{20}z_0z$ | 250 ($B_{20}$) |
| $B_{20}$ | 500 | $6B_{30}z_0z^2 + 2B_{30}z_0^3$ | 83.3 ($B_{30}$) |
| $B_{30}$ | 100 | $8B_{40}z_0z^3 + 8B_{40}z_0^3z$ | 12.5 ($B_{40}$) |
| $B_{40}$ | 50 | $10B_{50}z_0z^4 + 20B_{50}z_0^3z^2 + 2B_{50}z_0^5$ | 5.0 ($B_{50}$) |
| $B_{50}$ | 10 | $12B_{60}z_0z^5 + 40B_{60}z_0^3z^3 + 12B_{60}z_0^5z$ | 0.83 ($B_{60}$) |
| $B_{60}$ | 5 | $14B_{70}z_0z^6 + 70B_{70}z_0^3z^4 + 42B_{70}z_0^5z^2 + 2B_{70}z_0^7$ | 0.36 ($B_{70}$) |

So, for example, a $B_{40}$ contaminant with a magnitude of 50 DHz can be corrected by a pair of $B_{50}$ shims placed symmetrically around the magnet isocentre with $z_0 = 1$ cm. In this case the fourth order correction term will be $10B_{50}z_0z^4 = 50z^4 = B_{40}z^4$. The correction will create an unwanted residual second order term of $20B_{50}z_0^3z^2$ and a DC offset, both of which can be corrected as discussed above.

Similarly, to produce a $B_{40}$ shim correction of 100 DHz would require the placement of two $B_{50}$ shims of magnitude $+/-10$ DHz a distance of $+/-1$ cm either side of the magnet isocentre. Alternatively, the shim strength may be adjusted by variation of the axial shim position $z_0$.

EXAMPLE 2

A further example of determining the required shims will now be provided. This example is based on a magnetic field:

$$B = B_{00} + B_0z + B_{20}z^2 + B_{30}z^3 + B_{40}z^4 \ldots$$

We will assume that:
$B_{10} = 1000$ DHz @1 cm
$B_{20} = 500$ DHz @1 cm
$B_{30} = 100$ DHz @1 cm
$B_{40} = 50$ DHz @1 cm We will also assume that higher order terms do not require correction. (However, the skilled reader would have no difficulty in extending this example to higher order terms if needed.) The magnetic field of interest therefore simplifies to:

$$B = B_{00} + 1000z + 500z^2 + 100z^3 + 50z^4 \ldots$$

We will assume that a set of shim pairs is available with shim magnitudes as follows:

| Correction term (Matched shims of order N + 1) | Shim magnitude (DHz @ 1 cm, $z_0 = 1$ cm) |
|---|---|
| $4B_{20}z_0z$ | 250 ($B_{20}$) |
| $6B_{30}z_0z^2 + 2B_{30}z_0^3$ | 83.3 ($B_{30}$) |
| $8B_{40}z_0z^3 + 8B_{40}z_0^3z$ | 12.5 ($B_{40}$) |
| $10B_{50}z_0z^4 + 20B_{50}z_0^3z^2 + 2B_{50}z_0^5$ | 5.0 ($B_{50}$) |

We will begin by determining a correction for the highest order term requiring correction, i.e. the fourth order term $50z^4$.

The fourth order correction is:

$$10B_{50}z_0z^4 + 20B_{50}z_0^3z^2 + 2B_{50}z_0^5$$

The strength of the fifth order shim pair providing that correction is $B_{50} = 5$, so the correction simplifies to:

$$50z_0z^4 + 100z_0^3z^2 + 10z_0^5$$

Our goal is to cancel the fourth order term, i.e.:

$$50z_0z^4 = 50z^4$$

So $z_0 = 1$ (i.e. the fifth order shims should be symmetrically arranged at $+1$ cm and $-1$ cm from centre).

The fourth order magnetic field and correction terms will cancel and we will have residual terms created by the fifth order shims of:

$$100z^2 + 10$$

And the resultant overall field becomes:

$$B = [B_{00} - 10] + 1000z + (500 - 100)z^2 + 100z^3$$

We will now determine a correction for the next highest order term requiring correction, i.e. the third order term $100z^3$.

The third order correction is:

$$8B_{40}z_0z^3 + 8B_{40}z_0^3z$$

$B_{40} = 12.5$, so the correction simplifies to:

$$100z_0z^3 + 100z_0^3z$$

Our goal is to cancel the third order term, i.e.:

$$100z_0z^3 = 100z^3$$

So $z_0 = 1$ (i.e. the fourth order shims are also symmetrically arranged at $+1$ and $-1$ cm from centre).

The third order terms will cancel and we will have a residual term created by the fourth order shims of:

$$100z$$

And the resultant overall field is:

$$B = [B_{00} - 10] + (1000 - 100)z + (500 - 100)z^2$$

We will now determine a correction for the next highest order term requiring correction, i.e. the second order term $400z^2$.

The second order correction is:

$$6B_{30}z_0z^2 + 2B_{30}z_0^3$$

$B_{30} = 83.3$, so the correction simplifies to:

$$500z_0z^2 + 167z_0^3$$

Our goal is to cancel the second order term, i.e.:

$$500z_0z^2 = 400z^2$$

So $z_0 = 0.8$ (i.e. the third order shims are symmetrically arranged at $+0.8$ and $-0.8$ cm from centre).

The second order terms will cancel and we will have a residual term created by the third order shims of:

$$167z_0^3 = 85$$

And the resultant overall field is:

$$B = [B_{00} - 10 - 85] + (1000 - 100)z$$

We will now determine a correction for the next highest order term requiring correction, i.e. the first order term $900z$.

The first order correction is:

$$4B_{20}z_0z$$

$B_{20}$=250, so the correction simplifies to:

$$1000z_0z$$

Our goal is to cancel the first order term, i.e.:

$$1000z_0z=900z$$

So $z_0$=0.9 (i.e. the second order shims are symmetrically arranged at +0.9 and −0.9 cm from centre).
And the resultant overall field is:

$$B=[B_{00}-10-85]$$

The fully corrected resultant overall field is independent of z.

The above example illustrates how the harmonics of a magnetic field may be shimmed by a set of shim pairs. Further, this example illustrates how the unwanted residual terms introduced by some shims may themselves be corrected by further shim pairs.

EXAMPLE 3

The correction provided by a shim pair will now be further illustrated by reference to a further third order shim pair for correction of a second order magnetic field term.

Figure 8:
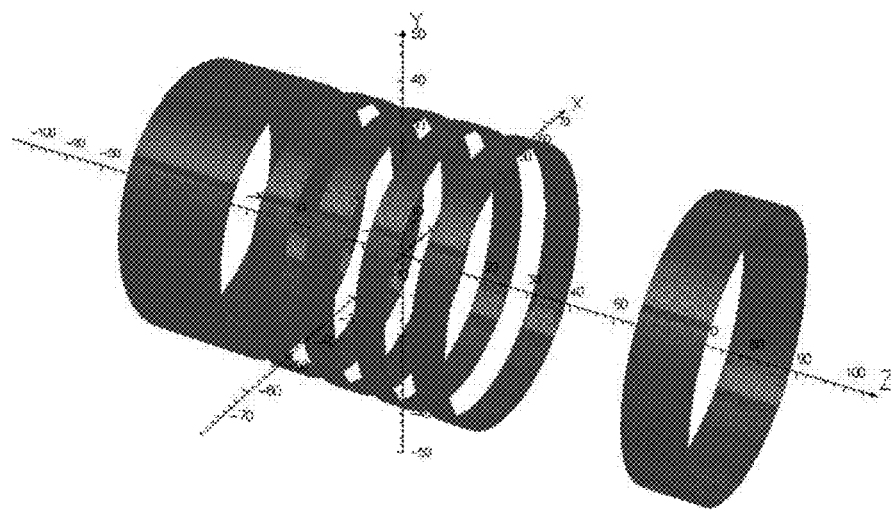
FIG. 8 is a plot of a third order shim according to one embodiment.
Figure 8A:
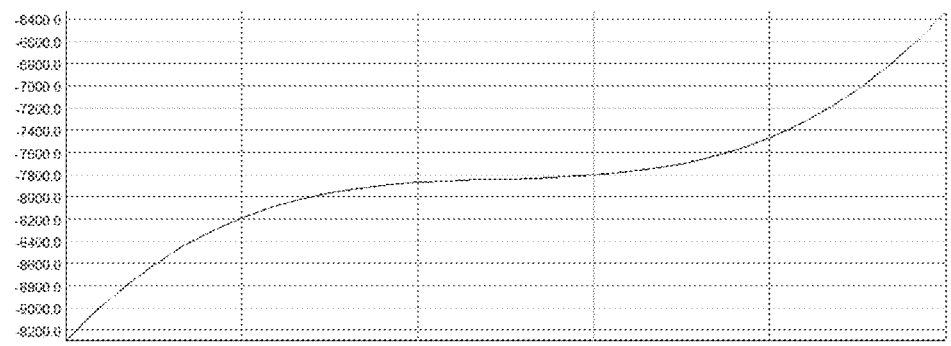
FIG. 8A illustrates the effect of the third order shim of FIG. 8.

FIG. 8 shows a plot of a $B_{30}$ shim producing +400 DHz of $B_{30}$ harmonic at 10 mm from isocentre. FIG. 8A shows the harmonic produced as a function of z.

Figure 9:
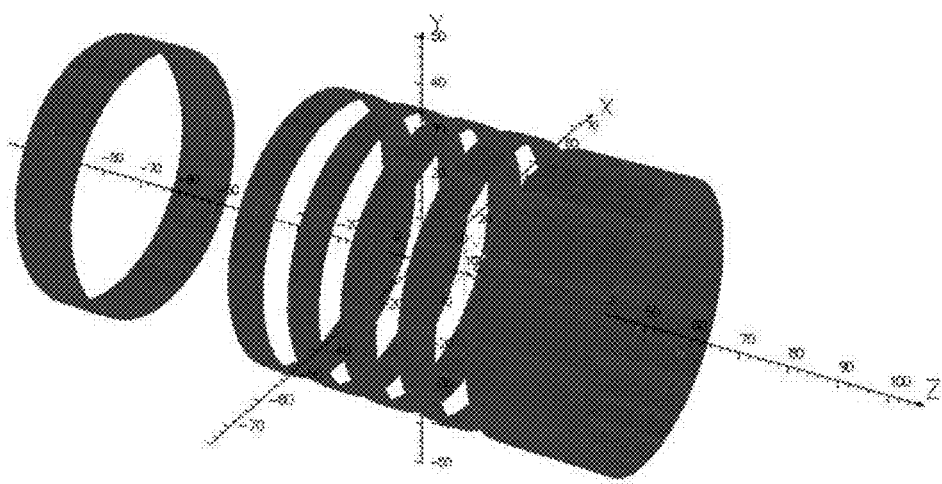
FIG. 9 is a plot of a further third order shim, equal and opposite to the shim of FIG. 8.
Figure 9A:
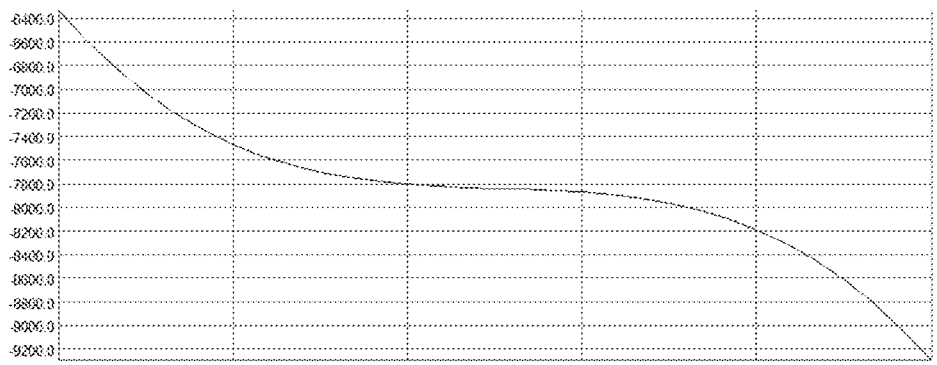
FIG. 9A illustrates the effect of the third order shim of FIG. 9.

FIG. 9 shows a plot of a $B_{30}$ shim producing −400 DHz of $B_{30}$ harmonic at 10 mm from magnetic isocentre. FIG. 9A shows the harmonic produced as a function of z. As shown, this is equal and opposite to the harmonic of FIG. 8A.

Figure 10:
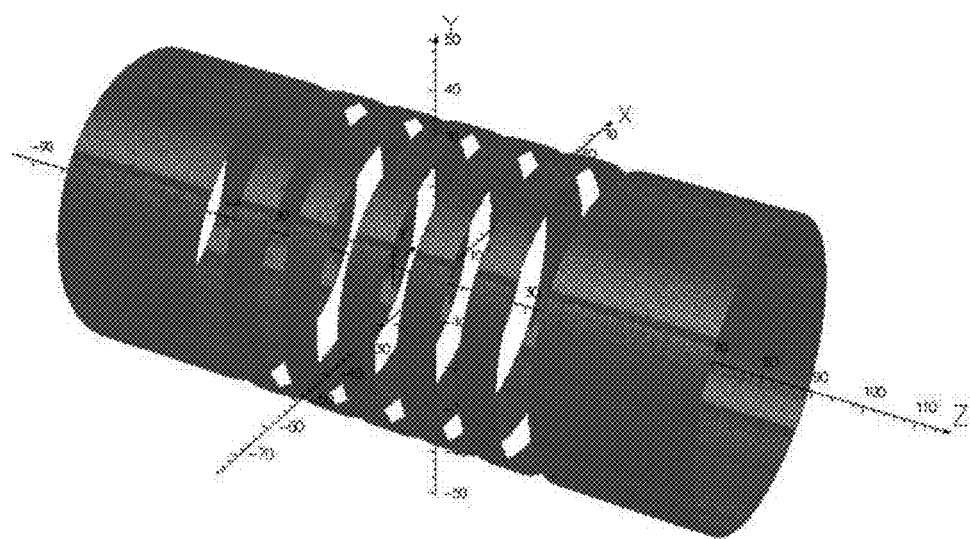
FIG. 10 shows a third order shim pair, consisting of the combined shims of FIGS. 8 and 9.
Figure 10A:
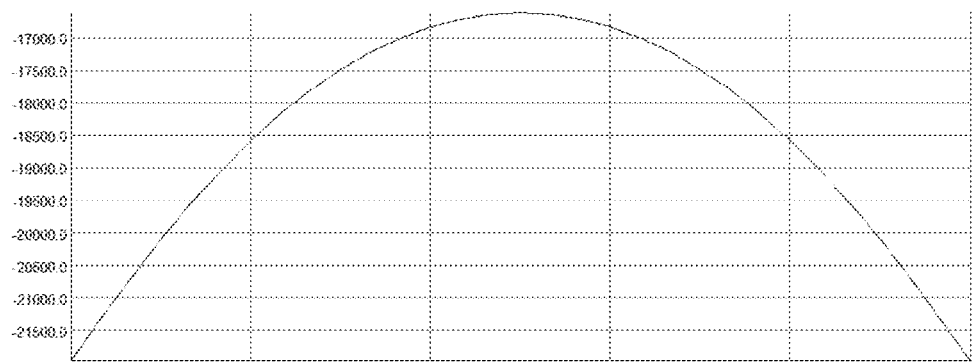
FIG. 10A illustrates the effect of the third order shim pair of FIG. 10.

FIG. 10 shows a plot of a +$B_{30}$ and −$B_{30}$ shim pair, with the shims separated by 20 mm producing a $B_{20}$ harmonic of +2400 DHz. FIG. 10A shows the correction produced as a function of z.

Figure 11:
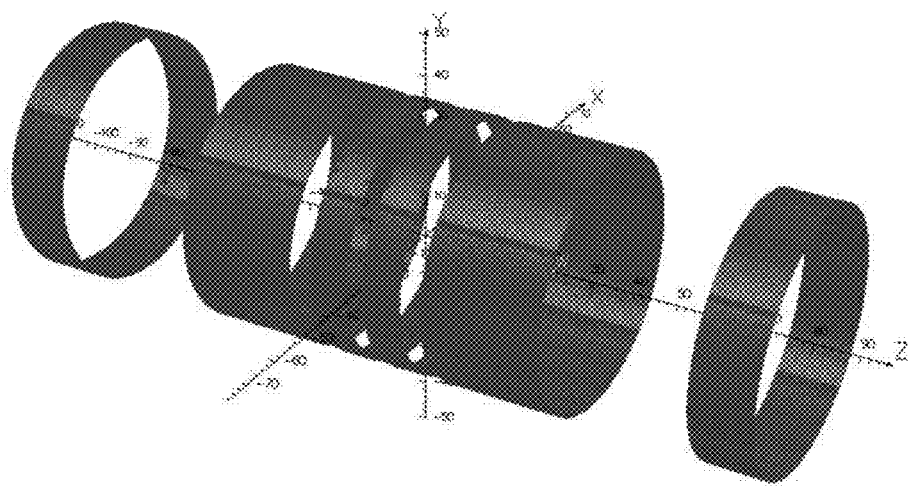
FIG. 11 shows another arrangement of the third order shim pair of FIG. 10.
Figure 11A:
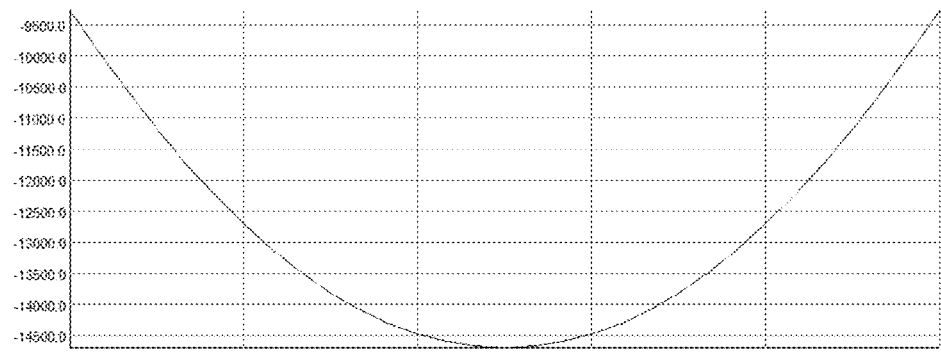
FIG. 11A illustrates the effect of the third order shim pair of FIG. 11.

FIG. 11 shows a plot of a +$B_{30}$ and −$B_{30}$ shim separated by 20 mm producing a $B_{20}$ harmonic of −2400 DHz. FIG. 11A shows the correction produced as a function of z. As shown, this is equal and opposite to the correction of FIG. 10A.

The above example demonstrates the creation of a $B_{20}$ harmonic from two $B_{30}$ passive shims. The relative positions of the two shims either side of the magnetic isocentre determine the polarity and magnitude of the resulting combined harmonic. In this example each $B_{30}$ shim is a maximum of 9 mil (=0.23 mm) in thickness and is comprised of six separate ferromagnetic rings. This shim design creates a very nearly pure $B_{30}$ harmonic, however there may be small amounts of unwanted contaminant harmonics created as well. A well designed shim can minimise these contaminant harmonics such that they become essentially irrelevant. The largest unwanted contaminant ($B_{60}$) in this example is <1% of the $B_{20}$ target harmonic, so the shim is substantially pure.

EXAMPLE 4

Figure 12:
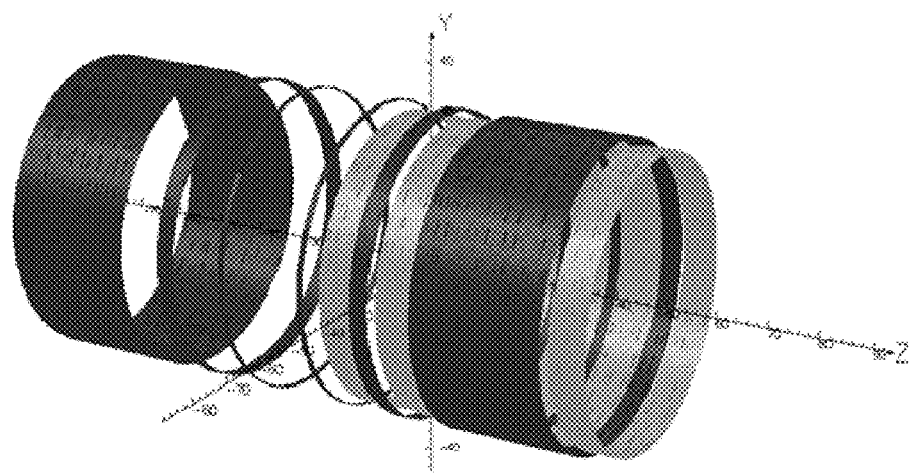
FIG. 12 shows a second order shim pair.
Figure 13:
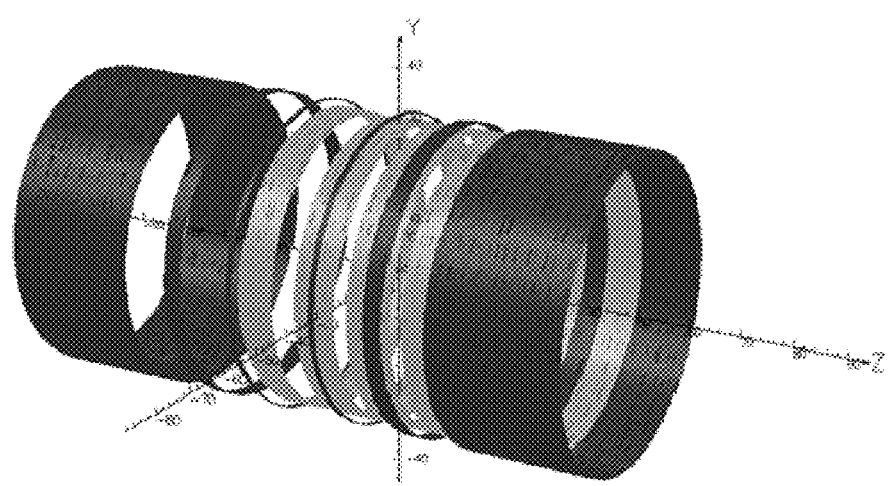
FIG. 13 shows a further arrangement of the second order shim pair of FIG. 12.
Figure 14:
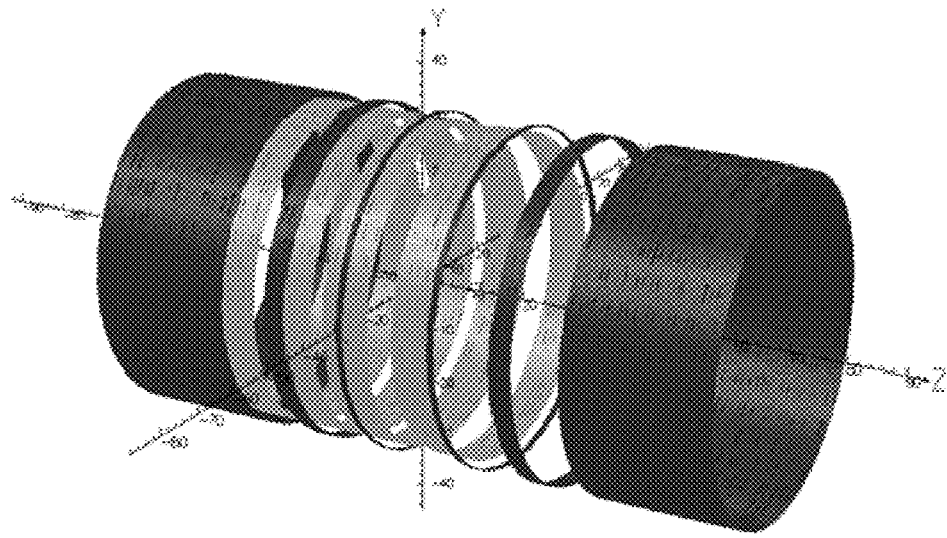
FIG. 14 shows a further arrangement of the second order shim pair of FIG. 12.
Figure 15:
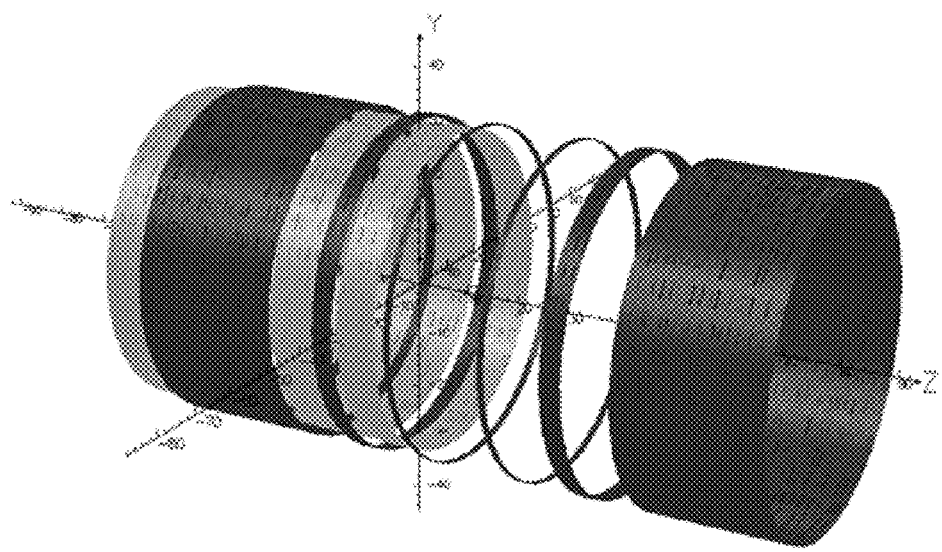
FIG. 15 shows a further arrangement of the second order shim pair of FIG. 12.
Figure 16:
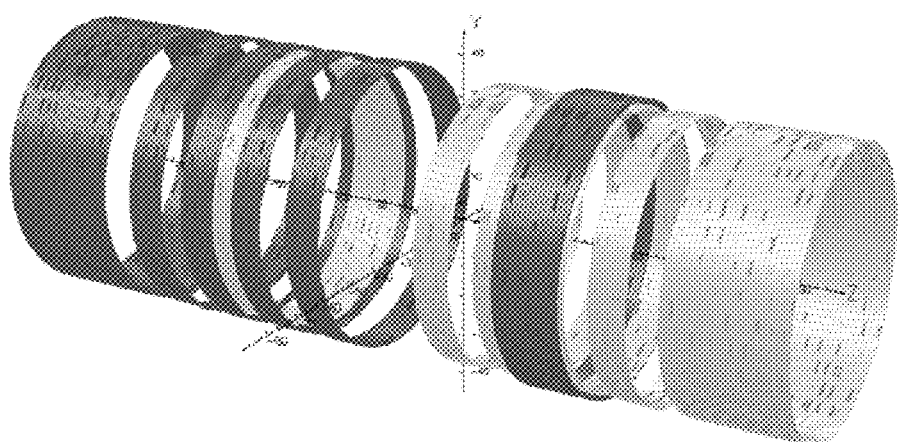
FIG. 16 shows a third order shim pair.

FIGS. 12 to 20 show various arrangements of shims.
FIG. 12 shows a second order +$B_{20}$ shim at $z_0$=+20 mm, and a −$B_{20}$ shim at $z_0$=−20 mm.
FIG. 13 shows a second order +$B_{20}$ shim at $z_0$=+10 mm, and a −$B_{20}$ shim at $z_0$=−10 mm.
FIG. 14 shows a second order +$B_{20}$ shim at $z_0$=−10 mm, and a −$B_{20}$ shim at $z_0$=+10 mm.
FIG. 15 shows a second order +$B_{20}$ shim at $z_0$=−20 mm, and a −$B_{20}$ shim at $z_0$=+20 mm.
FIG. 16 shows a third order +$B_{30}$ shim at $z_0$=−20 mm, and a −$B_{30}$ shim at $z_0$=+20 mm.

Figure 17:
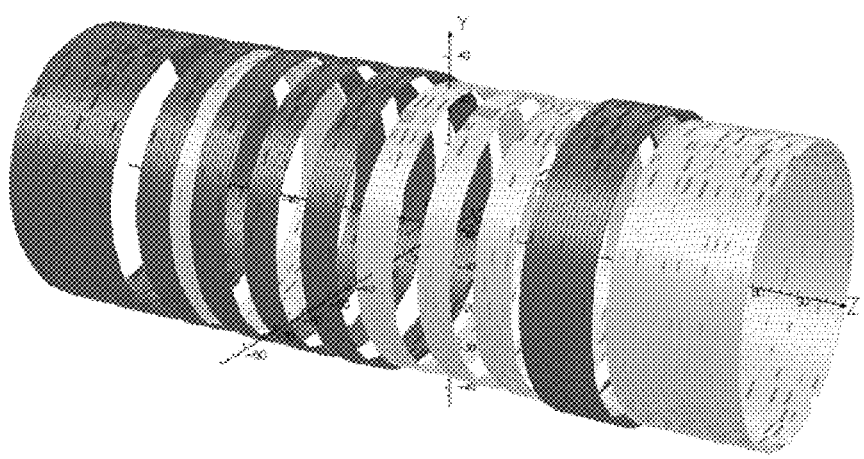
FIG. 17 shows a further arrangement of the third order shim pair of FIG. 16.
Figure 18:
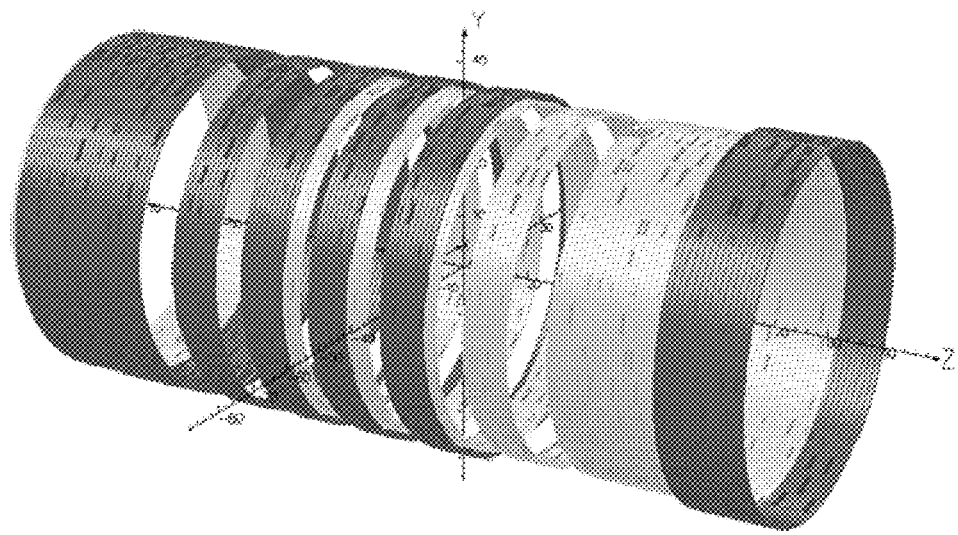
FIG. 18 shows a further arrangement of the third order shim pair of FIG. 16.
Figure 19:
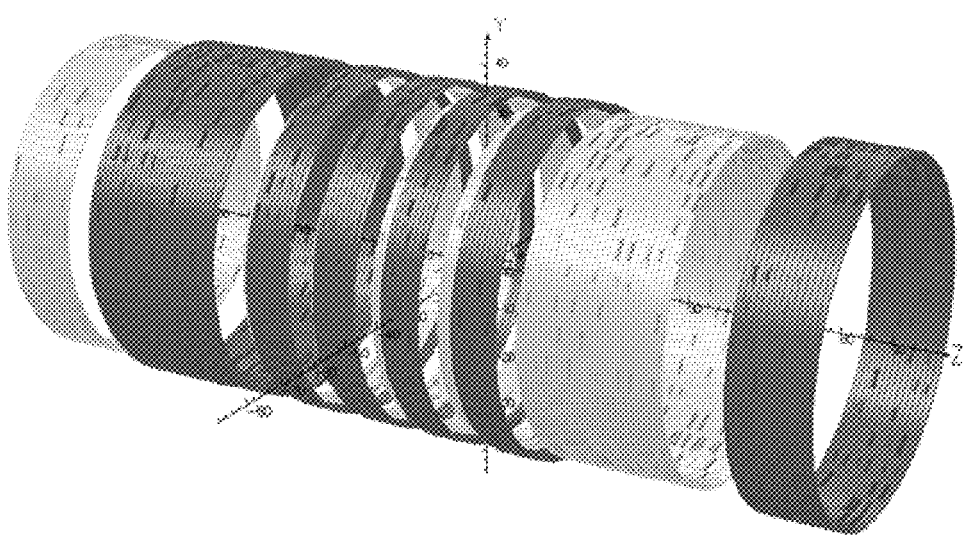
FIG. 19 shows a further arrangement of the third order shim pair of FIG. 16.
Figure 20:
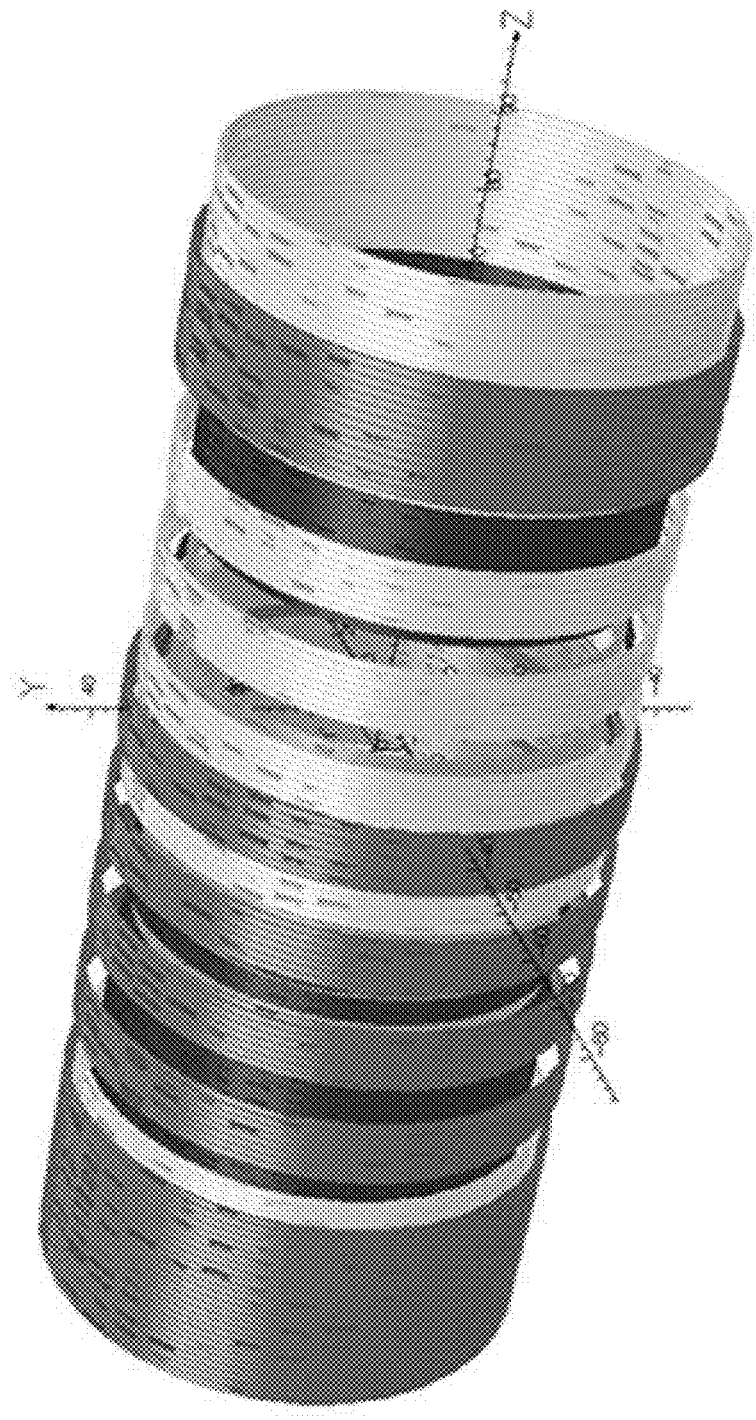
FIG. 20 shows a second order shim pair and a third order shim pair arranged concentrically.

FIG. 17 shows a third order +$B_{30}$ shim at $z_0$=−10 mm, and a −$B_{30}$ shim at $z_0$=+10 mm.
FIG. 18 shows a third order +$B_{30}$ shim at $z_0$=+10 mm, and a −$B_{30}$ shim at $z_0$=−10 mm.
FIG. 19 shows a third order +$B_{30}$ shim at $z_0$=+20 mm, and a −$B_{30}$ shim at $z_0$=−20 mm.
FIG. 20 shows +$B_{20}$, −$B_{20}$, +$B_{30}$ and −$B_{30}$ all arranged at $z_0$=0. While this value of $z_0$ provides a zero shimming effect, this figure illustrates how the shims may be arranged concentrically with respect to each other. This may be extended to any required number of shim pairs, and any required value of $z_0$ for each shim.

EXAMPLE 5

Figure 21:
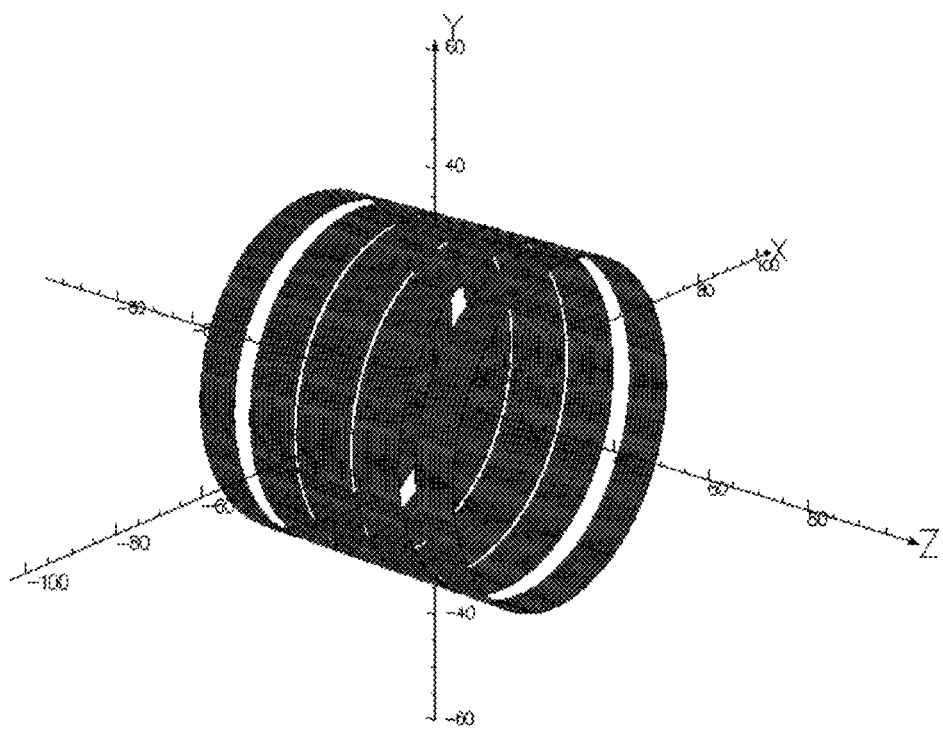
FIG. 21 shows a second order shim according to another embodiment.
Figure 22:
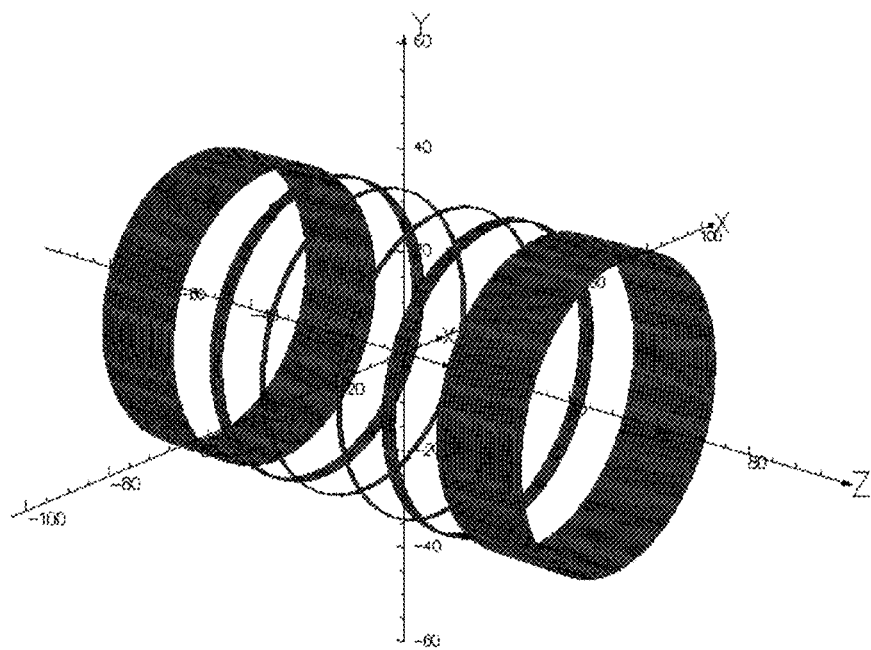
FIG. 22 shows a further second order shim, anti-symmetric to the shim of FIG. 21.

FIG. 21 shows a plot of a −$B_{20}$ shim with a strength of −1000 DHz. FIG. 22 shows a plot of a +$B_{20}$ shim with a strength of +1000 DHz. Each shim consists of a number of ferromagnetic rings arranged along the z axis. As shown, the two shims of FIGS. 21 and 22 form an anti-symmetric shim pair. That is, the shim of FIG. 21 includes ferromagnetic rings corresponding to the spaces between rings in FIG. 22. The shims of FIGS. 21 and 22 create equal, but opposite, correction harmonics. Together, the shims of FIGS. 21 and 22 provide a second order shim pair for correction of a first order harmonic.

Figure 23:
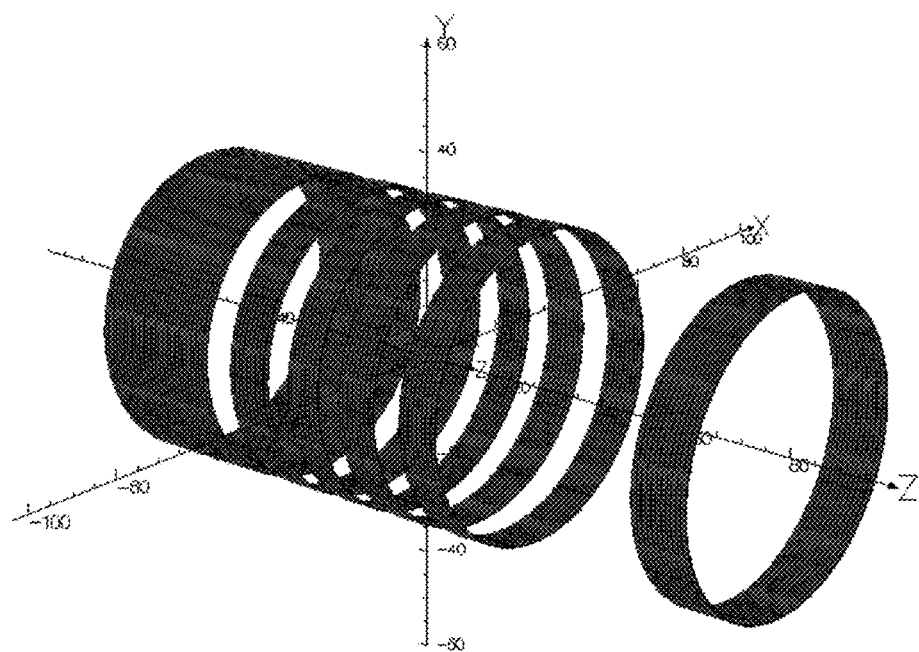
FIG. 23 shows a third order shim according to a further embodiment.
Figure 24:
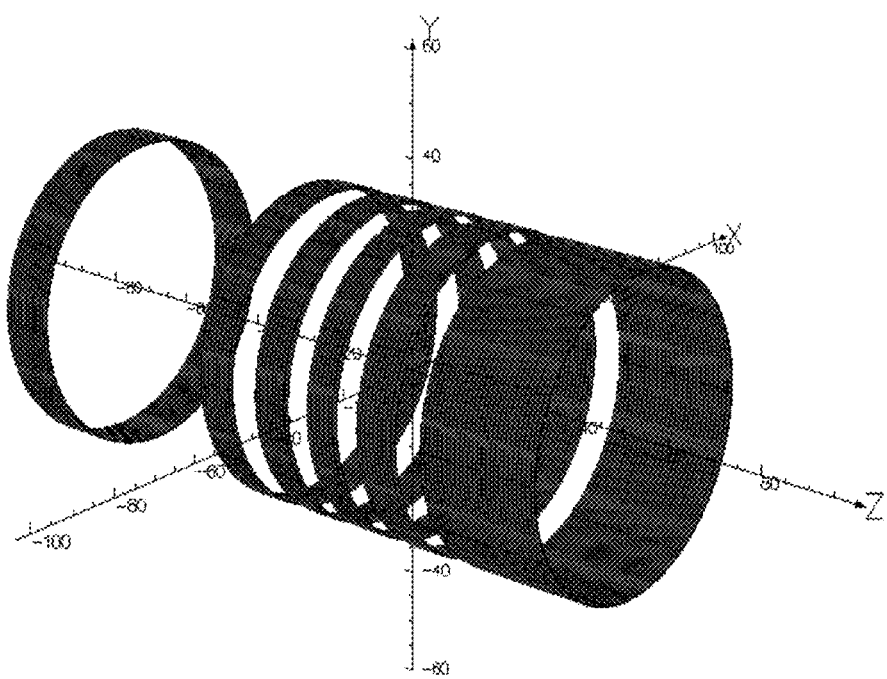
FIG. 24 shows a further third order shim, equal and opposite to the shim of FIG. 23.

FIGS. 23 and 24 show plots of third order −$B_{30}$ and +$B_{30}$ shims respectively. These shims have strengths of −500 DHz and +500 DHz respectively. The two shims of FIGS. 23 and 24 form a symmetric shim pair. That is, the shim of FIG. 23 includes shims similar to those of FIG. 24, but in opposite order. The shims of FIGS. 23 and 24 create equal, but opposite, correction harmonics. Together, the shims of FIGS. 23 and 24 provide a third order shim pair for correction of a second order harmonic.

Figure 25:
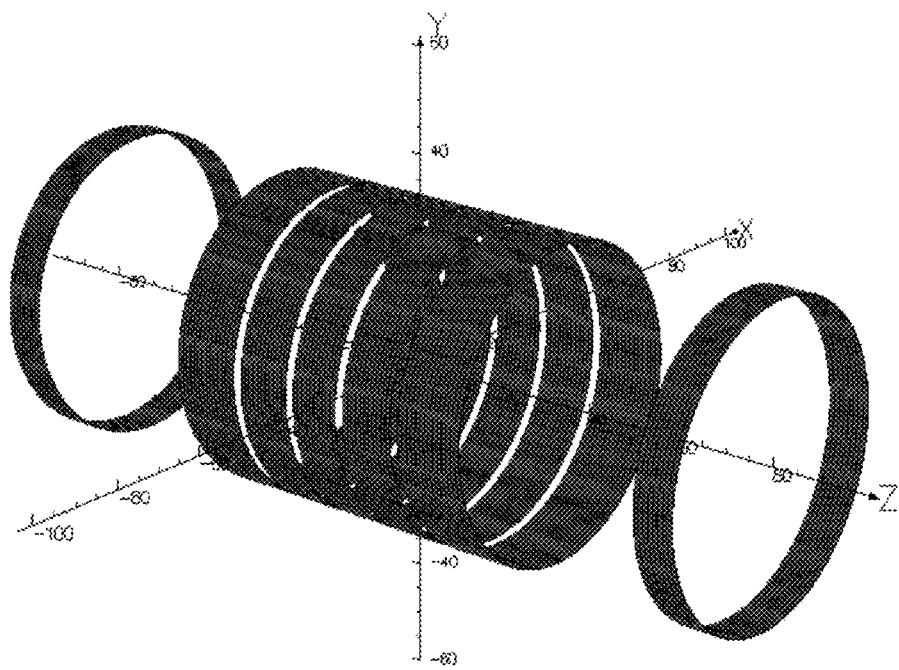
FIG. 25 shows a fourth order shim according to a further embodiment.
Figure 26:
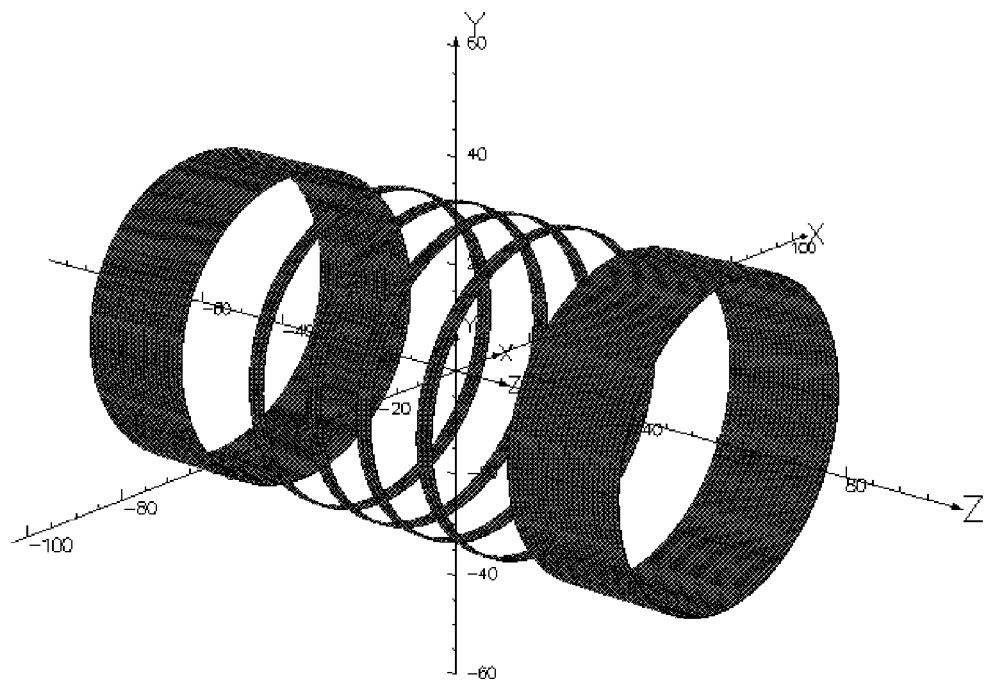
FIG. 26 shows a further fourth order shim, anti-symmetric to the shim of FIG. 21.

FIGS. 25 and 26 show plots of fourth order −$B_{40}$ and +$B_{40}$ shims respectively. These shims have strengths of −100 DHz and +100 DHz respectively. The two shims of FIGS. 25 and 26 form an anti-symmetric shim pair. The shims of FIGS. 25 and 26 create equal, but opposite, correction harmonics. Together, the shims of FIGS. 25 and 26 provide a fourth order shim pair for correction of a third order harmonic.

Higher order correction shims generally require more ferromagnetic elements to create 'pure' or relatively pure correction harmonics.

Shim Design

As described above, each shim may include a number of shim elements. The shim elements are preferably radially symmetric. The shim elements may be formed on a tubular support or substrate.

The shim strength depends on the materials used and the amount of magnetic or ferromagnetic material used, as is well understood in the art. Further, below the saturation magnetization of the shim material the shim strength is dependent upon the background magnetic field. Above the saturation magnetization the shim strength is then independent of the background magnetic field. The saturation magnetization of typical low carbon steels can be in the range 1.7-2.3 tesla.

The shims may be designed by a computer algorithm that calculates where to place pieces of steel to create a given harmonic. It is well known that a permanent magnet, or magnetized piece of ferromagnetic material can be represented using a current sheet approach or a magnetic dipole approach, amongst other methods. This allows a distribution of magnetic material to be modeled using a linear programming algorithm, which allows rapid calculation of diverse material dispositions. The computer modeling of dispositions of magnetic material can be applied to an optimization algorithm. There are a number of optimization techniques available which are familiar to those skilled in the art of passive shimming. In one embodiment, a 'target field' optimization approach may be used, similar to the approach used for calculating where individual tiles are placed in conventional passive shimming. In one method a matrix of magnetic field or magnetic field harmonic values is created by calculating the magnetic field generated by small pieces of magnetic material disposed on the surface of a cylindrical shape around the region of interest. This matrix provides a known set of sensitivities between the disposition of magnetic material and their affect on the homogeneity of a magnetic field on a given surface, usually spherical or cylindrical in nature. The skilled practitioner will realize that regular, annular pieces of magnetic material will create predominantly or exclusively axial harmonics in the magnetic field. A computer algorithm can use the matrix of sensitivities to calculate the position of rings of ferromagnetic material to create a given magnitude of a particular harmonic. This allows the individual shims to be designed. In this invention the algorithm is used to design a series of ferromagnetic shims which are regular cylindrical in shape. The invention can also include the design of ferromagnetic shims on non-cylindrical surfaces which allow the two shims that form a shim pair to be disposed with respect to each other along a specific coordinate axis.

Where cylindrical tubular shims of various diameters are to be used, the algorithm should be constrained to the cylindrical tubular shape, and the diameter is altered as appropriate for each shim.

Shim Manufacture

The Applicant's shims may be manufactured as follows, with reference to FIGS. 27 to 30. The material thicknesses are exaggerated in these drawings for illustrative purposes.

Figure 27:
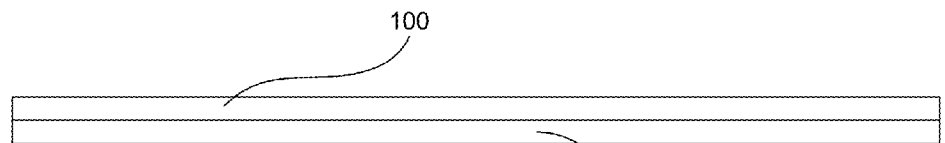
FIG. 27 shows laminated ferromagnetic and nonmagnetic layers.
Figure 28:
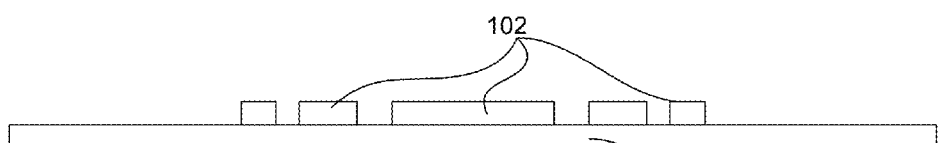
FIG. 28 shows how the ferromagnetic layer may be etched to form the shim elements.
Figure 29:
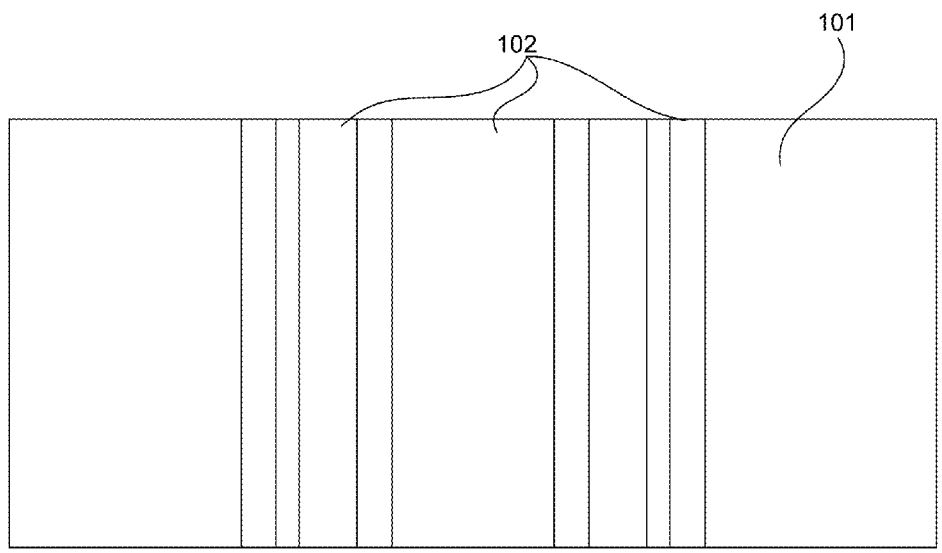
FIG. 29 is a top view of the layers shown in FIG. 28.

A flat sheet of steel 100 may be glued or otherwise laminated onto a support or substrate 101 (FIG. 27). For clarity the glue layer is not shown. The substrate material could be Biaxially-oriented polyethylene terephthalate (e.g. the material sold under the brand Mylar), Polyether ether ketone (PEEK), polyester or some other suitably flexible material. A conventional photo-etching process may then be used to chemically etch away the unwanted parts of the steel sheet to leave the required steel bands 102, as shown in FIGS. 28 and 29.

Figure 30:
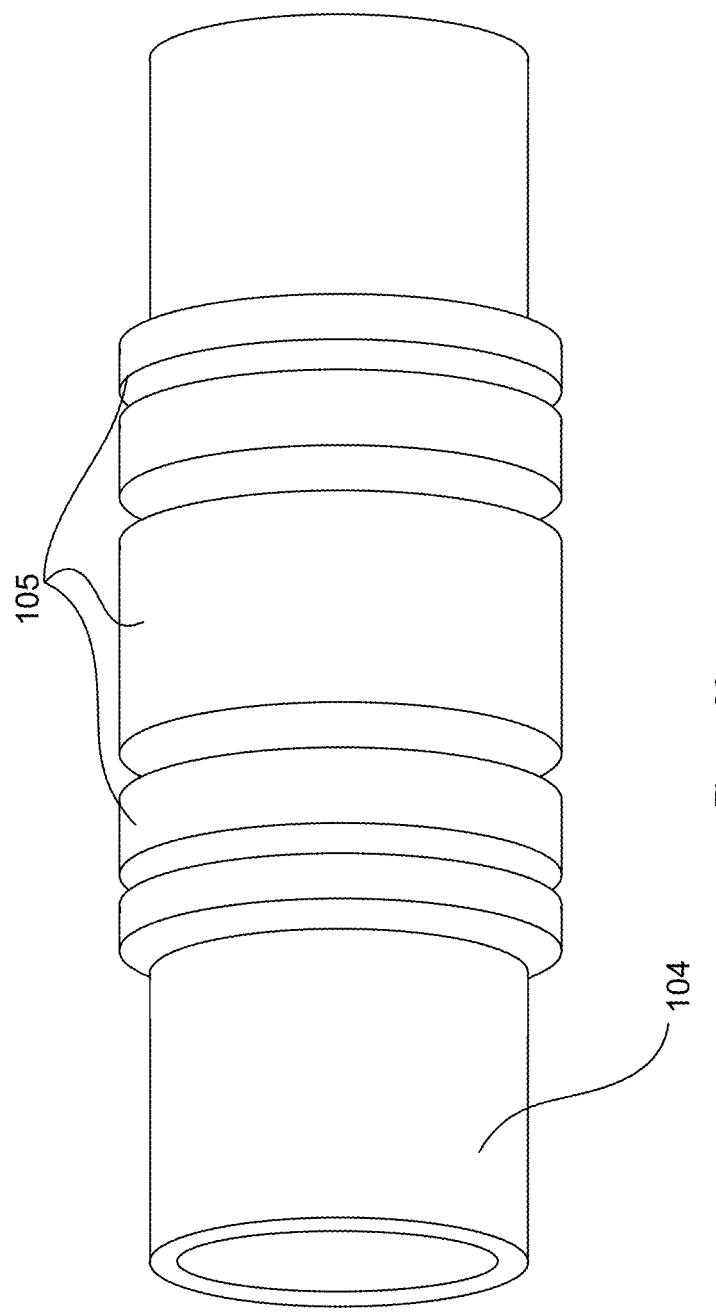
FIG. 30 shows how the layers of FIGS. 28 and 29 may be formed into a cylinder.

The etched composite assembly may then be wrapped around a suitable cylindrical form and, if necessary, any excess overlapping material may be trimmed away. The substrate then forms a tubular support 104, with the shim elements 105 forming annular elements around the circumference of the support 104, as shown in FIG. 30.

In some embodiments the wrapped assembly may be glued to form a fixed cylindrical shim. In other embodiments the shims may be formed around and permanently mounted on a tubular cylindrical form. That tubular form may then be inserted into the magnet assembly.

The above steps may be repeated for each required shim (e.g. to correct harmonics Z1 to Z6, a set of at least 12 shims will be required).

In preferred embodiments the shims are relatively thin, to take up minimum space in the magnet bore. Preferably the support or substrate is between 0.025 and 1 mm in thickness, more preferably around 0.025 to 0.050 mm in thickness. Preferably the ferromagnetic shim elements are between 0.025 and 1 mm in thickness, more preferably around 0.025 to 0.075 mm in thickness.

In one embodiment the substrate may be formed from 0.025 mm thick PEEK, with the ferromagnetic shim elements formed from a 0.025 mm thick steel sheet (such as is available as a mechanical shim material). The glue layer may be as thin as possible, preferably less than 0.025 mm in thickness. The total thickness of the Z1 to Z6 correction set would then be 12×(3*0.025)=~0.9 mm.

The shim pieces will be held in place so that they cannot move along the axial direction by either using a suitable adhesive tape or by using an applied adhesive to locate them in position. A re-locatable adhesive (e.g. similar to that used on post-it notes) may be suitable in some applications so that the shimming process can easily be iterated.

Other manufacturing methods may occur to the skilled reader.

In some applications the shims may be formed from permanent magnet material rather than ferromagnetic material. Such shims could be used to create variable, pure harmonics without a background magnetic field. This may have applications in ultra-low field MRI (e.g. Earth's field MRI) to allow for accurate shimming of low magnitude magnetic fields or creation of a magnetic field with a desired set of field harmonics.

However, in preferred embodiments the shim material is a ferromagnetic material. This is generally understood to be analogous to mild steel, however any magnetisable material could be used instead. Suitable materials are available for use in mechanical shimming of engineering parts. A low carbon steel may be used, preferably in the range SAE C1008 to C1010. In some NMR and MRI applications a low carbon mild steel may be used, but it may be preferable to use 'nearly' non-magnetic materials (that is, weakly magnetic materials) to provide fine tuning of the created harmonics (e.g. stainless steel grade 304 after cold working). The magnetisable material can be substituted by a permanent magnet material to provide a magnetic field effect even when there is no background magnetic field. The material may be the same for all shims, or a range of ferromagnetic materials could be employed to provide for an extra level of adjustability.

The Applicant's shim arrangement may rely on a fixed, pre-made number of ferromagnetic shims, adjusting their behaviour by relative positioning of the shims. A fixed set of shim pairs may therefore be provided for shimming of harmonics up to order N. In one embodiment there may be a single shim pair per harmonic to be corrected. However, in other embodiments more than one shim pair per harmonic may be provided. This would mean that each harmonic could be corrected by a coarse, high power shim pair and then fine-tuned by a fine, low power shim pair, with potentially a third pair dealing with the transition from coarse correction to fine correction. However, each shim pair takes up useful space within the magnet bore so the number of shim pairs needs to be balanced against the required measurement volume within the magnet bore. For some applications the number of shim pairs should be kept to a minimum, for example a single shim pair may be used for each contaminant harmonic.

Preferably however each shim pair is relatively pure in the target harmonic. If the shims are accurately designed then they will be substantially pure (apart from a DC term). In this specification, the term "substantially pure" means that the shim provides a correction in a target harmonic, possibly with a DC term (that is a term of zero$^{th}$ order in z), and with any unwanted error terms of first or higher order in z being small, with magnitudes preferably less than of order 5-10% of the target harmonic correction magnitude.

For example, a second order shim will usually have a small unwanted fourth order term, and an even smaller unwanted sixth order term, but these error terms can be made to be vanishingly small, as the skilled reader will understand.

The invention is applicable to any solenoidal (and some split pair) magnet systems that require a high homogeneity volume within the magnet bore. In general this will be NMR and MRI magnets but may also extend to other magnet systems that have similar high homogeneity requirements. Where permanent magnetic materials are used the invention may be used to create desired magnetic fields independent of any other magnet arrangement, or may be used for shimming of background magnetic fields such as the Earth's field.

The invention may be used instead of conventional ferromagnetic shimming techniques (involving the placing of ferromagnetic 'tiles' within the magnet bore) or may be used instead of electrical shimming methods, either superconducting or room temperature.

The invention is ideally suited for high temperature superconductor applications since it can produce higher magnetic field correction terms than are generally available from room temperature electric shim sets and does not require permanent connection to a power supply that would be necessary if a high temperature superconducting shim set were to be used.

Each shim pair preferably provides a symmetric shim term. However, this may be achieved using symmetric or anti-symmetric shims as discussed above.

The invention therefore relies upon pairs of relatively pure axial shims of equal but opposite magnitude. It would be possible to use less pure shims (shims which create mixed harmonics) but these would make the shimming process more complicated. The shims may be mounted on a single diameter cylindrical former however the shim could be manufactured using a variety of inner and outer diameters as long as the created magnetic fields are equal in magnitude and opposite in polarity. However, depending on the structure used this could lead to difficulties in moving the shims relative to each other. A preferred embodiment provides a set of shim pairs, including all the necessary shim pairs from $B_{10}$ to $B_{N+1,0}$ where N is the maximum harmonic to be corrected.

Thus, in preferred embodiments the invention uses a pair of equal magnitude but opposite polarity shims to correct a given contaminant harmonic. The number of shim pairs used is dependent upon the contaminant harmonics to be corrected.

The invention is intended to improve the homogeneity of magnetic fields. In the preferred embodiment it may be used to correct the contaminant harmonics of a Nuclear Magnetic Resonance (NMR) or Magnetic Resonance Imaging (MRI) magnet.

The invention may be used for shimming of magnets that are solenoidal in form although it may also be possible to use the invention to shim split pair magnets under certain conditions.

While the invention has been primarily described in relation to removing unwanted harmonics from the magnetic field, the invention may be used in almost any circumstance where the magnetic field within a certain volume needs to be modified. This modification may be either by improving the homogeneity of the field or by introducing a given strength of a particular field harmonic, or strengths of a desired set of harmonics.

The individual ferromagnetic shims will produce a relatively pure harmonic correction term over a specific volume, usually near the centre of the shim pair. Outside of this defined volume the magnetic field created will no longer exhibit the pure harmonic nature of the specified volume. This means that the shim pairs will generally only work adequately over a well-defined volume. This limits the available range over which they can function and so will define a practicable maximum and minimum available correction harmonic.

For instance a typical NMR magnet might have a sensitive volume that is cylindrical in nature, 20 mm long and 10 mm in diameter. It would be necessary to manufacture correction shims that provide a relatively pure harmonic over a greater axial length than the sensitive volume of the NMR magnet. If the usable length of the created harmonic is for instance 40 mm then the shim pair can be adjusted for a maximum correction harmonic by moving the shim pair to positions + and −10 mm either side of the magnetic centre of the sensitive volume. If they are moved further apart than this then the created harmonic is no longer relatively pure and unwanted contaminant terms will be introduced.

This also defines a usable resolution of the correction term since the accuracy with which the shims can be placed within the bore tube will define the smallest correction available. If the shims can be moved +/−10 mm on either side of the magnetic isocentre then it is reasonable to suggest that if they are placed by hand that the minimum change of spacing would be of order 0.5 mm, this would mean that over the complete correction range there would be 40 individual correction steps from full positive correction to full negative correction. This then defines either the maximum available contaminant correction or the resolution within which any individual harmonic term can be corrected. As has been suggested previously a second fine tune shim can then further improve the resolution is so wished. If the placement of the shims with respect to each other can be better controlled (e.g. by a controlled adjustment mechanism or coupled mechanical linkage) then the available correction resolution can be much higher and the adjustment effectively infinitely small.

Further, an adjustment mechanism (e.g. a mechanical linkage) with a suitable control arrangement may allow the shims to be moved whilst they are inside the magnet bore and with the magnet energised. This will allow the shimming to be adjusted while the field is monitored.

Adjustment of the shims will generally be conducted during manufacture or installation of the magnetic apparatus. However, where adjustability is desired at a later time the Applicant's shims may be provided with a suitable adjustment system allowing their positions to be adjusted by an operator.

While the present invention has been illustrated by the description of the embodiments thereof, and while the embodiments have been described in detail, it is not the intention of the Applicant to restrict or in any way limit the scope of the appended claims to such detail. Additional advantages and modifications will readily appear to those skilled in the art. Therefore, the invention in its broader aspects is not limited to the specific details, representative apparatus and methods, and illustrative examples shown and described. Accordingly, departures may be made from such details without departure from the spirit or scope of the Applicant's general inventive concept.

What is claimed is:

1. A passive magnetic field shim arrangement including a plurality of shim pairs, each shim pair including a first shim of order N and a second opposite and substantially equal shim of order N, the first and second shims together defining a magnetic field shim correction of order N−1, wherein each shim pair contributes a shimming term that is substantially pure in a single magnetic field harmonic.

2. An arrangement as claimed in claim 1, each shim pair being configured for shimming a single magnetic field harmonic.

3. An arrangement as claimed in claim 1 wherein each shim includes one or more shim elements arranged on a non-magnetic tubular support, the tubular supports being dimensioned such that the tubular supports may be arranged concentrically in relation to each other.

4. A passive magnetic field shim arrangement including a plurality of shim pairs, each shim pair including a first shim and a second opposite and substantially equal shim, the first and second shims together defining an axially symmetric or anti-symmetric shim pair, wherein each shim pair contributes a shimming term that is substantially pure in a single magnetic field harmonic.

5. An arrangement as claimed in claim 4 wherein the plurality of shim pairs is a continuous set of shim pairs configured to shim magnetic field harmonics from first order up to a highest order magnetic field harmonic desired to be corrected.

6. An arrangement as claimed in claim 4 wherein the plurality of shim pairs includes at least one shim pair per magnetic harmonic to be corrected.

7. An arrangement as claimed in claim 4 wherein the plurality of shim pairs includes a first shim pair configured for shimming a first magnetic field harmonic and a second shim pair configured for fine shimming of the first magnetic field harmonic.

8. An arrangement as claimed in claim 4 wherein the shims are configured to shim axial cylindrical harmonics of the magnetic field.

9. An arrangement as claimed in claim 4 configured for installation in a magnetic apparatus, to shim a magnetic field in that apparatus so as to improve homogeneity of the magnetic field in a measurement region.

10. An arrangement as claimed in claim 4 wherein each shim includes shim elements of ferromagnetic or permanent magnetic material.

11. An arrangement as claimed in claims 4 further including an adjustment mechanism configured for controllable adjustment of the positions of the shims.

12. An arrangement as claimed in claims 4 wherein each shim includes one or more shim elements arranged on a non-magnetic tubular support.

13. An arrangement as claimed in claim 12 wherein the tubular supports are dimensioned such that the tubular supports may be arranged concentrically in relation to each other.

14. An arrangement as claimed in claim 12 wherein the tubular supports have circular cross-sections.

15. An arrangement as claimed in claims 12 wherein the tubular supports are arranged to slide with respect to each other.

16. An arrangement as claimed in claims 4 wherein each shim includes a plurality of shim elements.

17. An arrangement as claimed in claim 16 wherein each shim element is radially symmetric.

18. An arrangement as claimed in claim 17 wherein each shim element is an annular element.

19. An arrangement as claimed in claim 4 configured for shimming a solenoidal magnet or a split pair magnet.

20. An arrangement as claimed in claim 4 configured for shimming a magnetic field in a nuclear magnetic resonance apparatus or a magnetic resonance imaging apparatus.

21. An arrangement as claimed in claim 4 wherein the magnitude of the correction provided by each shim pair is a function of the axial positions of the first and second shims.

22. A magnetic apparatus including one or more magnets defining a magnetic field in a measurement region, and an arrangement as claimed in claim 4 configured to shim the magnetic field in the measurement region.

* * * * *